United States Patent
Navarro et al.

(10) Patent No.: US 10,074,900 B2
(45) Date of Patent: Sep. 11, 2018

(54) SCALABLE PLANAR PACKAGING ARCHITECTURE FOR ACTIVELY SCANNED PHASED ARRAY ANTENNA SYSTEM

(71) Applicant: The Boeing Company, Chicago, IL (US)

(72) Inventors: Julio A. Navarro, Renton, WA (US); Douglas A. Pietila, Kent, WA (US)

(73) Assignee: THE BOEING COMPANY, Chicago, IL (US)

( * ) Notice: Subject to any disclaimer, the term of this patent is extended or adjusted under 35 U.S.C. 154(b) by 284 days.

(21) Appl. No.: 15/018,747

(22) Filed: Feb. 8, 2016

(65) Prior Publication Data

US 2017/0229775 A1 Aug. 10, 2017

(51) Int. Cl.
*H01Q 3/26* (2006.01)
*H01P 3/16* (2006.01)
*H01Q 21/00* (2006.01)
*H05K 3/30* (2006.01)
*H01Q 1/02* (2006.01)

(52) U.S. Cl.
CPC ............ *H01Q 3/26* (2013.01); *H01P 3/16* (2013.01); *H01Q 1/02* (2013.01); *H01Q 3/267* (2013.01); *H01Q 21/0006* (2013.01); *H01Q 21/0025* (2013.01); *H01Q 21/0093* (2013.01); *H05K 3/30* (2013.01)

(58) Field of Classification Search
USPC ........................................................ 342/361
See application file for complete search history.

(56) References Cited

U.S. PATENT DOCUMENTS

| 4,535,337 A | * | 8/1985 | MacAnlis | ............. | H01Q 11/04 |
| | | | | | 343/737 |
| 5,786,793 A | * | 7/1998 | Maeda | .................... | H01Q 1/38 |
| | | | | | 343/700 MS |
| 6,424,313 B1 | | 7/2002 | Navarro et al. | | |

(Continued)

FOREIGN PATENT DOCUMENTS

WO    WO 2015/111609    7/2015

OTHER PUBLICATIONS

Pitts et al., "Multi-Function Shared Aperture Array", U.S. Appl. No. 14/671,479, filed Mar. 27, 2015, 32 pages.

*Primary Examiner* — Harry K Liu
(74) *Attorney, Agent, or Firm* — Haynes and Boone, LLP

(57) ABSTRACT

Systems and methods according to one or more embodiments are provided for a scalable planar phased array antenna subarray tile assembly. A scalable phased array antenna subarray tile assembly is implemented as a printed wiring board (PWB) with antenna elements coupled to the PWB. In one example, a PWB includes integrated circuit die attached directly to a first surface of the PWB and couple to antenna elements coupled on a second surface of the PWB. First conductive vias extend through a first subset of PWB layers and couple to the integrated circuit die. Second conductive vias, larger than the first, extend through a second subset of PWB layers and couple to the antenna elements. A conductive trace couples the first and second conductive vias on a PWB layer. The second conductive vias are offset from the first to provide a thermal mechanical stress relief to the integrated circuit die.

36 Claims, 15 Drawing Sheets

(56) References Cited

U.S. PATENT DOCUMENTS

| | | | |
|---|---|---|---|
| 6,580,402 B2 | 6/2003 | Navarro et al. | |
| 6,670,930 B2 | 12/2003 | Navarro | |
| 6,744,411 B1 | 6/2004 | Osterhues et al. | |
| 6,989,791 B2 | 1/2006 | Navarro et al. | |
| 7,417,598 B2 | 8/2008 | Navarro et al. | |
| 7,443,354 B2 | 10/2008 | Navarro et al. | |
| 7,579,997 B2 * | 8/2009 | Navarro | H01Q 13/06 343/700 MS |
| 7,714,775 B2 | 5/2010 | Navarro | |
| 7,884,768 B2 | 2/2011 | Navarro et al. | |
| 7,889,135 B2 | 2/2011 | Blaser et al. | |
| 8,188,932 B2 | 5/2012 | Worl et al. | |
| 8,395,559 B1 * | 3/2013 | Josypenko | H01Q 15/24 343/756 |
| 8,421,220 B2 * | 4/2013 | Knickerbocker | H01L 25/0652 257/712 |
| 8,842,055 B2 * | 9/2014 | Murdock | H01Q 1/52 343/892 |
| 2009/0143038 A1 * | 6/2009 | Saito | H01Q 1/007 455/272 |
| 2009/0284415 A1 | 11/2009 | Won et al. | |
| 2011/0068991 A1 * | 3/2011 | Jang | H01Q 1/243 343/787 |
| 2012/0313818 A1 | 12/2012 | Puzella et al. | |
| 2013/0069831 A1 * | 3/2013 | Friedman | H01Q 21/065 343/702 |
| 2015/0325925 A1 | 11/2015 | Kamgaing et al. | |
| 2015/0381229 A1 * | 12/2015 | Tzanidis | H01Q 1/50 455/73 |
| 2016/0195676 A1 * | 7/2016 | Yu | G02B 6/1226 385/11 |
| 2016/0282462 A1 | 9/2016 | Pitts et al. | |
| 2016/0306034 A1 * | 10/2016 | Trotta | H01Q 9/0407 |
| 2016/0336654 A1 | 11/2016 | Aoki et al. | |
| 2017/0244175 A1 * | 8/2017 | Iwanaka | H01Q 21/24 |

\* cited by examiner

SCALABLE PLANAR PACKAGING ARCHITECTURE FOR ACTIVELY SCANNED PHASED ARRAY ANTENNA SYSTEM

TECHNICAL FIELD

One or more embodiments relate generally to phased array antennas and, more particularly, for example, to scalable planar phased array antenna subarray tile assemblies.

BACKGROUND

In the field of phased array antennas, there is an ongoing effort to provide an affordable high fidelity phased array subarray tile assembly for use as a building block in phased array antennas. Typically, phased array antenna systems (e.g., subarray tile assemblies) are designed and manufactured in large array configurations to meet particular applications. Such systems are complex requiring many parts and many hours to fabricate, assemble, and test the end product. Furthermore, larger and more complex assemblies are difficult to manufacture adding to higher costs due to lower yields.

Conventional techniques employed for providing phased array antennas tend to be single point solutions for particular applications. As such, these products are, for the most part, expensive and less adaptable. For example, existing solutions for providing a lower cost high fidelity antenna array often rely on integrating more functionality into larger array tile assemblies. However, larger array tile assemblies add complexity to printed wiring boards in multiple laminations, thicker overall board dimensions, higher via-aspect ratios, and large number of vias resulting in lower-yield of manufactured assemblies and higher cost.

Accordingly, there is a need for an improved phased array antenna implementation that provides high fidelity phased array antenna performance without excessive cost.

SUMMARY

Systems and methods are disclosed herein in accordance with one or more embodiments that provide an improved approach to providing a scalable planar phased array antenna subarray tile assembly. In some embodiments, a subarray tile assembly is implemented as a printed wiring board (PWB) with antenna elements coupled to the PWB. In one example, a PWB may include integrated circuit die attached directly to the PWB and coupled to the antenna elements. A single integrated circuit die may include four beamforming circuits and couple to four antenna elements to perform beamforming operations. The integrated circuit die is coupled to the antenna elements through conductive vias formed in the PWB. Microvias formed in PWB layers couple to the integrated circuit die. The microvias are coupled to larger plated through hole vias, where the plated through hole vias are offset to provide a thermal mechanical stress relief to the integrated circuit die. The plated through hole vias extend through layers of the PWB and are coupled to the antenna elements.

In one embodiment, a system includes a phased array antenna subarray tile assembly comprising a printed wiring board (PWB) comprising a plurality of layers; an integrated circuit die coupled to a first surface of the PWB; an antenna element coupled to a second surface of the PWB; a first conductive via having a first diameter, the first conductive via being coupled to the integrated circuit die and extending through a first subset of the layers; a second conductive via having a second diameter larger than the first diameter, the second conductive via being offset from the first conductive via, extending through a second subset of the layers, and being coupled to the antenna element; a conductive trace of the PWB coupled to the first and second conductive vias; and wherein the offset of the second conductive via provides a thermal mechanical stress relief to the integrated circuit die.

In another embodiment, a system includes a subarray tile assembly comprising a substantially planar printed wiring board (PWB) comprising a plurality of layers; one or more integrated circuit die coupled to a first surface of the PWB; at least four antenna elements coupled to a second surface of the PWB, wherein the at least four antenna elements are arranged in a square lattice grid on the PWB; and wherein the integrated circuit die is electrically coupled to each of the four antenna elements through the layers.

In another embodiment, a method includes passing an RF signal along a conductive path through a printed wiring board (PWB) between an integrated circuit die and an antenna element, wherein the conductive path comprises: a first conductive via having a first diameter, the first conductive via being coupled to the integrated circuit die and extending through a first subset of layers of the PWB; a second conductive via having a second diameter larger than the first diameter, the second conductive via being offset from the first conductive via, extending through a second subset of layers of the PWB, and being coupled to the antenna element; and a conductive trace of the PWB coupled to the first and second conductive vias.

In another embodiment, a method includes providing a printed wiring board (PWB) comprising a plurality of layers; providing an integrated circuit die coupled to a first surface of the PWB; providing an antenna element coupled to a second surface of the PWB; electrically coupling the integrated circuit die to a first conductive via extending through a first subset of the layers; and electrically coupling the first conductive via to a second conductive via offset from the first conductive via, extending through a second subset of the layers, and coupled to the antenna element.

In another embodiment, a method includes providing a metallic honeycomb structure comprising a plurality of cylindrical waveguides configured to interface with a plurality of phased array antenna subarray tile assemblies; forming a recess along a surface of each of the cylindrical waveguides; filling the cylindrical waveguides and the recesses with a dielectric material; and wherein each filled recess mechanically secures the dielectric material to the cylindrical waveguide.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

DETAILED DESCRIPTION

Figure 1:
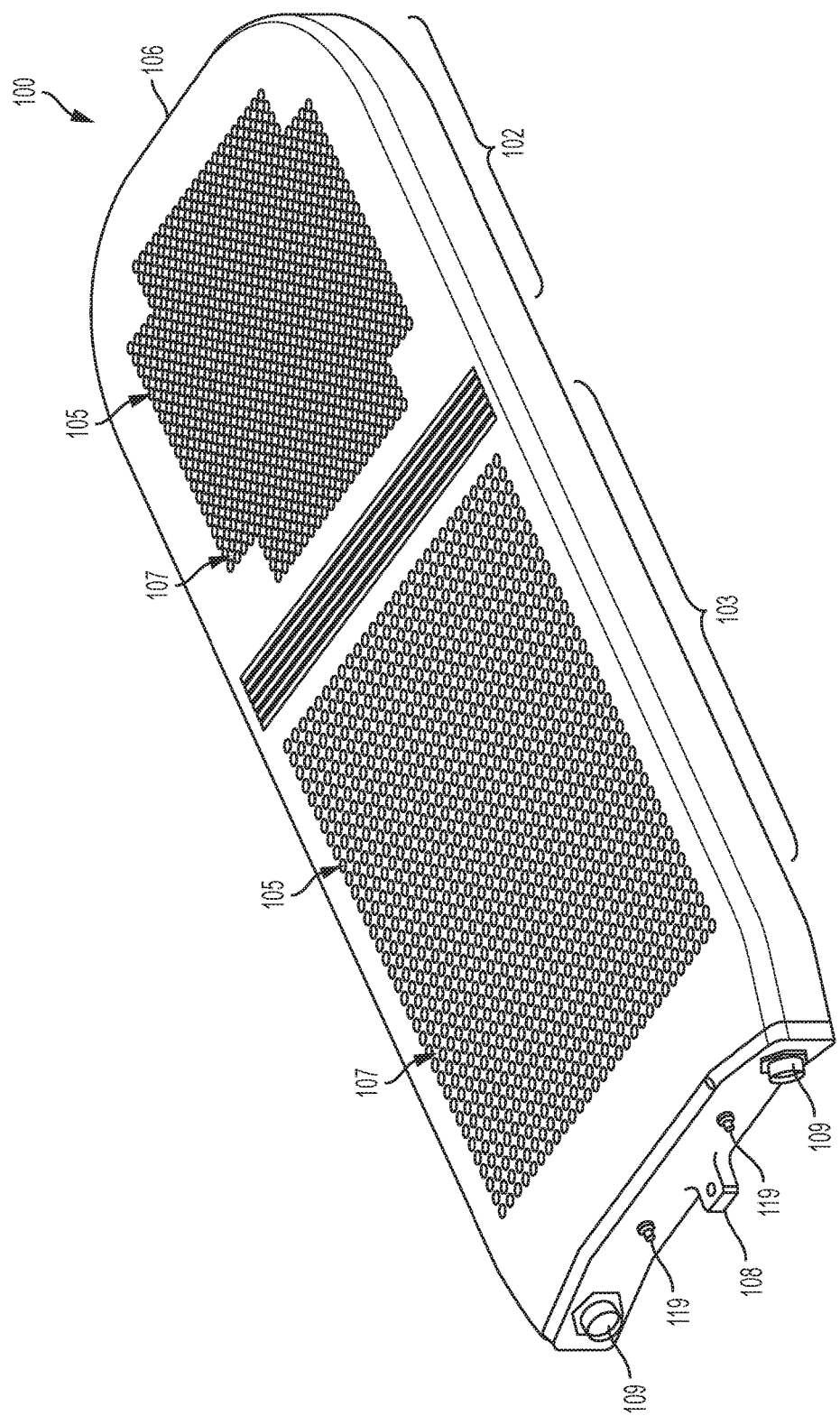
FIG. 1 illustrates an external view of a phased array antenna system in accordance with an embodiment of the disclosure.

Embodiments of the present disclosure provide for a scalable subarray tile assembly that significantly reduces parts count, fabrication processing, manufacturing/assembly steps and phase array antenna costs. As such, the scalable subarray tile assembly can be replicated in any planar direction to develop a larger integrated phased array aperture.

In some embodiments, an antenna integrated printed wiring board (AiPWB) includes a first subset of thin pre-pegs/copper layers adjoining a first surface (e.g., a top surface) to accommodate a plurality of first conductive vias (e.g., laser drilled microvias). The first conductive vias are used for direct connection to high density integrated circuit die incorporating fine pitch ball grids. By utilizing thin pre-pegs/copper layers and laser drilled microvias on the first subset of layers, the AiPWB design can accommodate fine pitch integrated circuit die attached directly to a top surface and connected through the layers of the AiPWB. This allows for increased electronic circuit packaging density not previously possible.

In some embodiments, the AiPWB includes a second subset of layers used, in part, as a waveguide transition section. Included in the second subset of layers are second conductive vias (e.g., plated through vias) coupled to the first conductive vias, extending through the second subset of layers and coupled to antenna elements on a second surface (e.g., a bottom surface). The second conductive vias are offset from the first conductive vias to provide a thermal and mechanical stress relief to the fine pitch integrated circuit die interconnect. Furthermore, the first and second conductive vias are coupled within the AiPWB by a conductive trace. In this regard, the fine pitch integrated circuit die directly attached to the top surface of the AiPWB is reliably coupled to the antenna element to provide for antenna beamforming operations.

In some embodiments, the integrated circuit die is fabricated from a silicon germanium (SiGe) alloy which requires less area for radio frequency (RF) electronics than conventional RF circuits, for example, such as gallium arsenide alloy. A single integrated circuit die contain element electronics to provide beamforming operations to four antenna elements. The area saved by using SiGe integrated circuit die and the ability to reliably connect the fine pitch ball grids to four antenna elements significantly reduces the area requirements on the lattice for electronics and simplifies the assembly of the array. The reduction in area requirements allows for implementation of a square planar subarray tile assembly, for example, as a 64 antenna element subarray tile assembly (e.g., an eight by eight matrix).

In some embodiments, implementing the AiPWB as a square planar subarray tile assembly allows for routing RF distribution circuits on the second subset of layers using the interstitial regions between the waveguides. Ground vias extending through the waveguide transition section (e.g., a second subset of the layers) are distributed around each second conductive via coupled to the antenna element to form a waveguide cage. In this regard, twenty-four ground vias may be used for each antenna element waveguide cage. The ground vias are re-used on the transition section layers to reduce radio frequency interference within the RF distribution circuit. By re-using ground vias, the AiPWB via count is significantly reduced (e.g., a tenfold reduction in vias) making for a less complex and cost effective AiPWB.

In some embodiments, a metallic honeycomb structure is coupled to the AiPWB. Cylindrical waveguides are formed within the metallic honeycomb structure and are coupled to the antenna elements. The waveguides may be filled with a dielectric material. The dielectric material may be chosen for properties that is low loss at RF frequencies and has the correct dielectric constant at RF frequencies. The dielectric material may be chosen to accommodate a lower waveguide cutoff frequency and a smaller diameter of the antenna element. Furthermore, a dielectric material may be chosen for a coefficient of thermal expansion (CTE) to match the metallic honeycomb. The dielectric material may be formed within the cylindrical waveguide opening using an injection molded or compression molded process. In some embodiments, recesses are formed along surfaces of the cylindrical openings to secure the dielectric material in the waveguide.

In some embodiments, additional AiPWB layers may be used to provide built-in test and in-flight calibration signals. Further, built-in test may be integrated into the SiGE integrated circuit to provide a self-test capability. The use of built-in test and in-flight calibration reduces the need for 100 percent test at the subarray tile assembly level while still maintaining a robust system test program translating into a significant cost savings.

In general, the AiPWB utilizes a more cost-effective subarray size (e.g., 64 elements arranged in an eight by eight matrix) in order to achieve a large array size. The subarray tile assembly is an integration of a variety of technologies to increase performance and functionality while reducing cost, size, weight and power of a scalable building block that varies sub-array dimensions and footprint to optimize fabrication, assembly, manufacturability and test of the integrated phased array antenna.

In one embodiment, a PWB may be provided that includes a plurality of integrated circuit die and antenna elements. The integrated circuit die are coupled to the antenna elements by conductive vias extending through a plurality of layers of the PWB. A first conductive extending through a first subset of the layers is coupled to the integrated circuit die. A second conductive via extending through a second subset of the layers is coupled to the antenna element. The second conductive via is offset from the first conductive via and coupled to the first conductive via by a conductive trace on a layer of the PWB.

In another embodiment, a subarray tile assembly may be provided that includes a substantially planar PWB and one or more integrated circuit die coupled to a first surface of the PWB. At least four antenna elements are arranged in a square lattice grid on a second surface of the PWB. A single integrated circuit die is electrically coupled to each of the four antenna elements through the layers of the PWB.

FIG. 1 illustrates an external view of a phased array antenna system 100 in accordance with an embodiment of the disclosure. Phase array antenna system 100 may be used to transmit and receive radio frequency (RF) communication or radar signals in accordance with various techniques described herein. Phased array antenna system 100 may be used on a variety of platforms, such as a land based, an airplane, or a space based platform. Phased array antenna system 100 includes a transmit antenna aperture 102 and a receive antenna aperture 103. In some embodiments, transmit antenna aperture 102 may include two thousand forty-eight transmit elements and receive antenna aperture may include two thousand six hundred eighty-eight receive elements. Phased array antenna system 100 may include an aperture housing 106 including one or more mounting flanges 108 to securely mount phased array antenna system 100 to a platform such as, for example, an airplane antenna fairing. Aperture housing 106 may include a metallic honeycomb structure 107 and a plurality of cylindrical waveguides 105 formed within metallic honeycomb structure 107. The metal of metallic honeycomb structure 107 may include aluminum in the form of pure aluminum or an aluminum alloy. In some embodiments, waveguides 105 may be configured as rectangular, square, or any other shape appropriate for a waveguide 105. Data and power feed through connectors 109 are provided for each of transmit antenna aperture 102 and receive antenna aperture 103 to receive and transmit data, and receive power from external sources. In some embodiments, circular flange mount connectors 109 are provided, however, other types of data and power RF feed connectors are possible. Coaxial RF feed through connectors 119 are provided for each of transmit and receive antenna apertures, 102 and 103. Phased array antenna system 100 provides for a shared aperture compact radar and communications antenna architecture to provide performance, size, and weight advantages.

Figure 2:
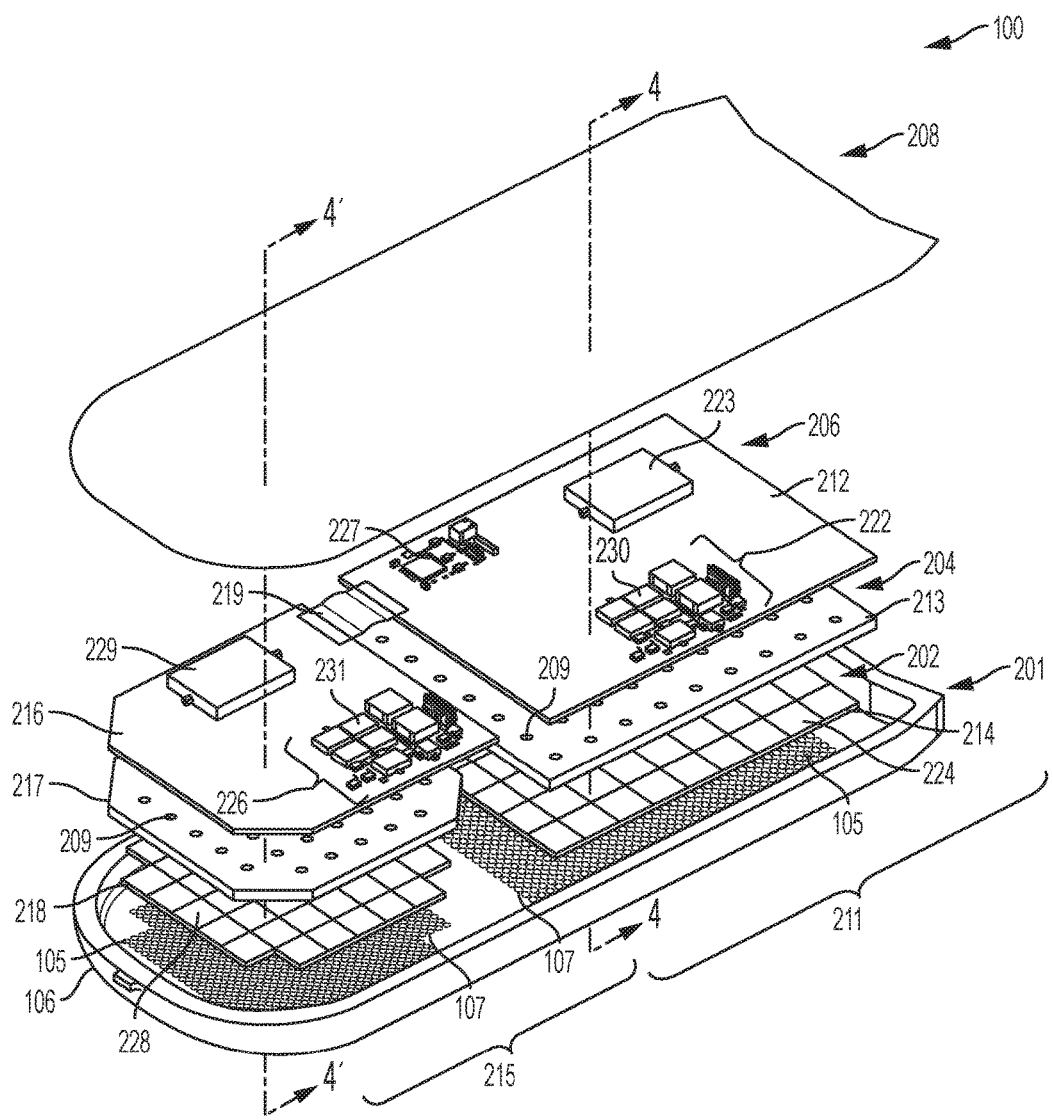
FIG. 2 illustrates an exploded view of a phased array antenna system in accordance with an embodiment of the disclosure.

FIG. 2 illustrates an exploded view of a phased array antenna system 100 in accordance with an embodiment of the disclosure. Phased array antenna system 100 may include an aperture assembly 201, an antenna array 202 including a receive phased array antenna subsystem 211 and a transmit phased array antenna subsystem 215, a cold plate assembly 204, an array distribution assembly 206, and a cover 208.

Aperture assembly 201 may include aperture housing 106 incorporating metallic honeycomb structure 107 and the plurality of cylindrical waveguides 105 formed within metallic honeycomb structure 107, as described herein. In some embodiments, cylindrical waveguides 105 may be filled with a dielectric material, as described herein. In some embodiments, dielectric material may be chosen to accommodate performance improvements. For example, improvements in scanning wide angles and increasing frequency bandwidth may require a dielectric material with properties to accommodate changes in waveguide cutoff frequency and element diameter associated with such improvements.

As shown in FIG. 2, antenna array 202 includes receive phased array antenna 214 and transmit phased array antenna 218. Each of receive phased array antenna 214 and transmit phased array antenna 218 include a plurality of phased array antenna subarray tile assemblies. In some embodiments, receive phased array antenna 214 includes forty-two receive phased array antenna subarray tile assemblies 224. In some embodiments, transmit phased array antenna 218 includes thirty-two transmit phased array antenna subarray tile assemblies 228. More or fewer subarray tile assemblies are possible in other embodiments of receive phased array antenna 214 and transmit phased array antenna 218. In this regard, the phased array subarray tile assembly (e.g., receive phased array antenna subarray tile assembly 224 and/or transmit phased array antenna subarray tile assembly 228) forms a scalable building block for use in a large phased array antenna.

In the embodiment shown in FIG. 2, a cold plate assembly 204 includes a receive cold plate 213 and a transmit cold plate 217. Cold plate assembly 204 may be configured to couple to antenna array 202 on a first surface and array distribution assembly 206 on a second surface. Cold plate assembly 204 may be configured to maintain a safe operating temperature for each of the coupled antenna array 202 and array distribution assembly 206. In some embodiments, residual heat from antenna array 202 and/or array distribution assembly 206 may be passively transferred to cold plate assembly 204. In other embodiments, cold plate assembly 204 may be formed with channels to accept a fluid in order to actively cool antenna array 202 and/or array distribution assembly 206. Receive cold plate 213 may be coupled to receive phased array antenna 214 on a first surface and a receive array distribution printed wiring board (PWB) 212 on a second surface. Transmit cold plate 217 may be coupled to transmit phased array antenna 218 on a first surface and a transmit array distribution printed wiring board (PWB) 216 on a second surface. A plurality of openings 209 formed through receive cold plate 213 and transmit cold plate 217 may accept connectors configured to provide an electrical interface between antenna array 202 and array distribution assembly 206, as described herein.

In the embodiment shown in FIG. 2, phased array antenna system 100 includes an array distribution assembly 206. Array distribution assembly 206 includes receive array distribution PWB 212 and transmit array distribution PWB 216 to provide power, data, clocks, and/or control signals to antenna array 202. In this regard, power and control circuit 222 of receive array distribution PWB 212 may provide RF, DC power, and control signals to each of receive subarray tile assemblies 224 of receive phased array antenna 214.

Furthermore, power and control circuit 222 may provide a controller 230 to interface with integrated circuit die of receive subarray tile assembly 224. Controller 230 may include, for example, a microprocessor, a logic device (e.g., a programmable logic device configured to perform processing operations), a digital signal processing (DSP) device, one or more memories for storing executable instructions (e.g., software, firmware, or other instructions), and/or any other appropriate combination of processing device and/or memory to execute instructions to perform any of the various operations described herein.

Figure 5:
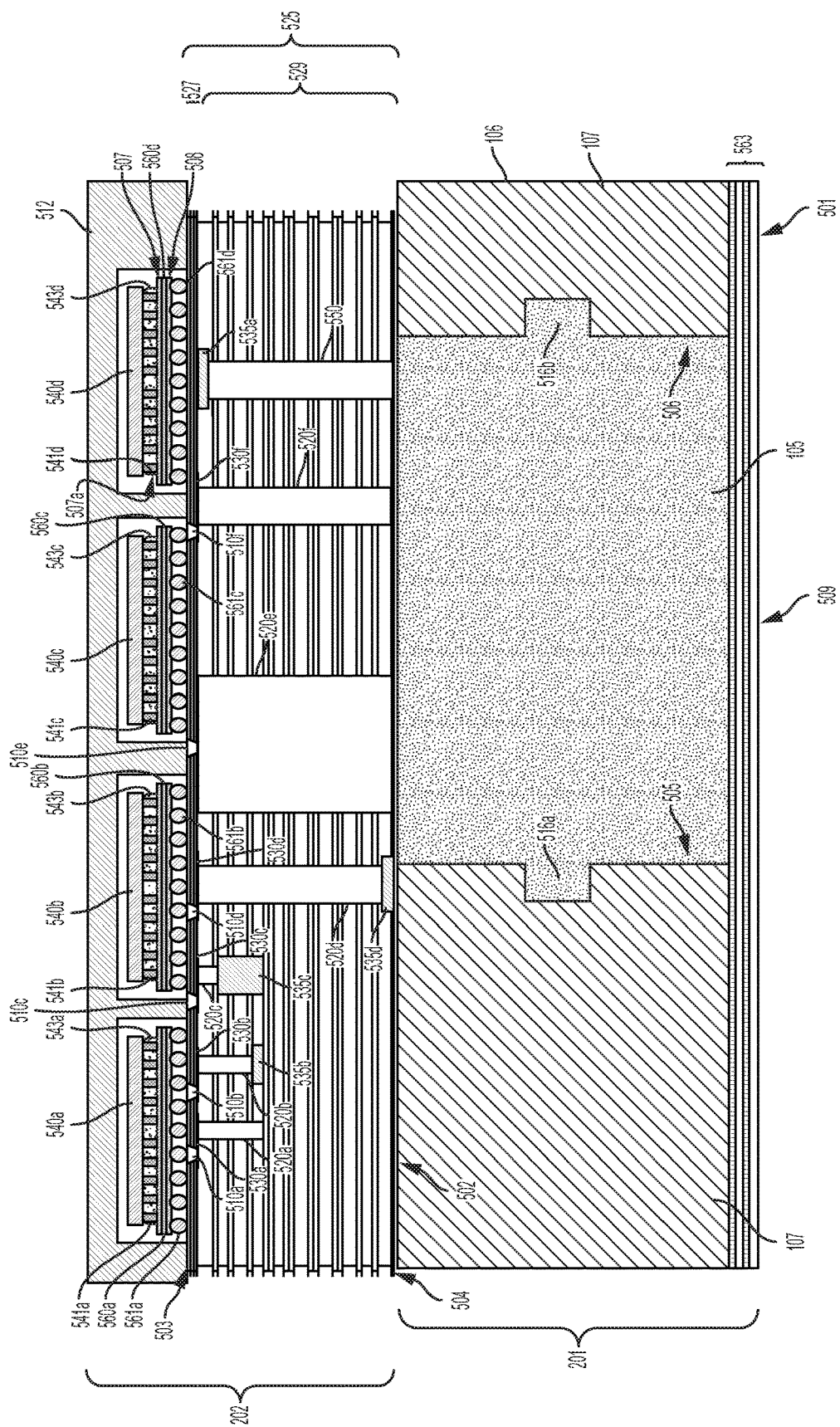
FIG. 5 illustrates a cross-section view of an AiPWB coupled to integrated circuit die and a waveguide in accordance with an embodiment of the disclosure.

Controller 230 of power and control circuit 222 may be coupled to a built-in test circuit (e.g., such as built-in test circuit 1162 of FIG. 11) formed within an integrated circuit die (e.g., such as integrated circuit die 540 of FIG. 5). In some embodiments, built-in test circuit may provide test signals substantially similar to system signals. In this regard, the built-in test circuit may be configured to provide a first test signal (1101a through 1101c) to the integrated circuit die 540 and receive a second test signal (1102a through 1102d) from the integrated circuit die 540. Controller 230 receives the second test signal to compare to a reference second test signal. Furthermore, an in-flight calibration circuit (e.g., such as in-flight calibration circuit 1164 of FIG. 11) may be formed within integrated circuit die 540. The in-flight calibration circuit may be configured to adjust an operation of the system in response to a signal received through the first conductive via. Providing a built-in test and in-flight calibration capability within integrated circuit die 540 allows for real-time monitoring of key performance parameters and early detection of performance degradation which provides a cost savings for testing and operating phased array antenna system 100.

RF converter 223 may be provided to convert radio frequency (RF) signals received from receive subarray tile assembly 224 to intermediate frequency (IF) signals and distribute IF signals off receive array distribution PWB 212 to other systems through coaxial RF feed through connector 119. Receive array distribution PWB 212 may include a beam steering circuit 227 used in processing polarized RF signals (e.g., such as polarized RF signals 1102a-b of FIG. 11) received from receive subarray tile assembly 224.

Transmit array distribution PWB 216 may include a power and control circuit 226 to provide RF, DC power, and control signals to each of transmit subarray tile assemblies 228 of transmit phased array antenna 218. Power and control circuit 226 may provide a controller 231 to interface with integrated circuit die (e.g., such as integrated circuit die 540 of FIG. 5) of transmit subarray tile assembly 228. Controller 231 is similar to controller 230 of power and control circuit 222, as described herein. Controller 231 of power and control circuit 226 may be coupled to a built-in test circuit formed within an integrated circuit die to receive a test signal from integrated circuit die to compare to a reference test signal, as described herein.

Furthermore, RF converter 229 may be configured to convert IF signals received from other systems through coaxial RF feed through connector 119 to RF signals and provide converted RF signals to transmit subarray tile assembly 228 for beamforming operations and transmission.

Interface connector 219 may be provided to electrically couple transmit array distribution PWB 216 to receive array distribution PWB 212.

As shown in FIG. 2, phased array antenna system 100 includes a cover 208 for protection from environmental, contamination and to provide an electromagnetic interference (EMI) enclosure.

In the embodiment shown in FIG. 2, phased array antenna system 100 includes receive phased array antenna subsystem 211 and transmit phased array antenna subsystem 215. Receive phased array antenna subsystem 211 includes receive array distribution PWB 212, receive cold plate 213, and receive phased array antenna 214 including forty-two receive subarray tile assemblies 224, as described herein. Transmit phased array antenna subsystem 215 includes transmit array distribution PWB 216, transmit cold plate 217, and transmit phased array antenna 218 including thirty-two transmit subarray tile assemblies 228, as described herein. In this regard, receive phased array antenna subsystem 211 and transmit phased array antenna subsystem 215 provide a compact fully integrated multi-function phased array antenna system 100 fitting all electronics, power, control, and RF connections to and from the array within the antenna fairing footprint. Phased array antenna system 100 achieves integration of multiple technologies into the fewest number of parts to reduce manufacturing processes, assembly time and per element costs of phased array antennas.

Figure 3:
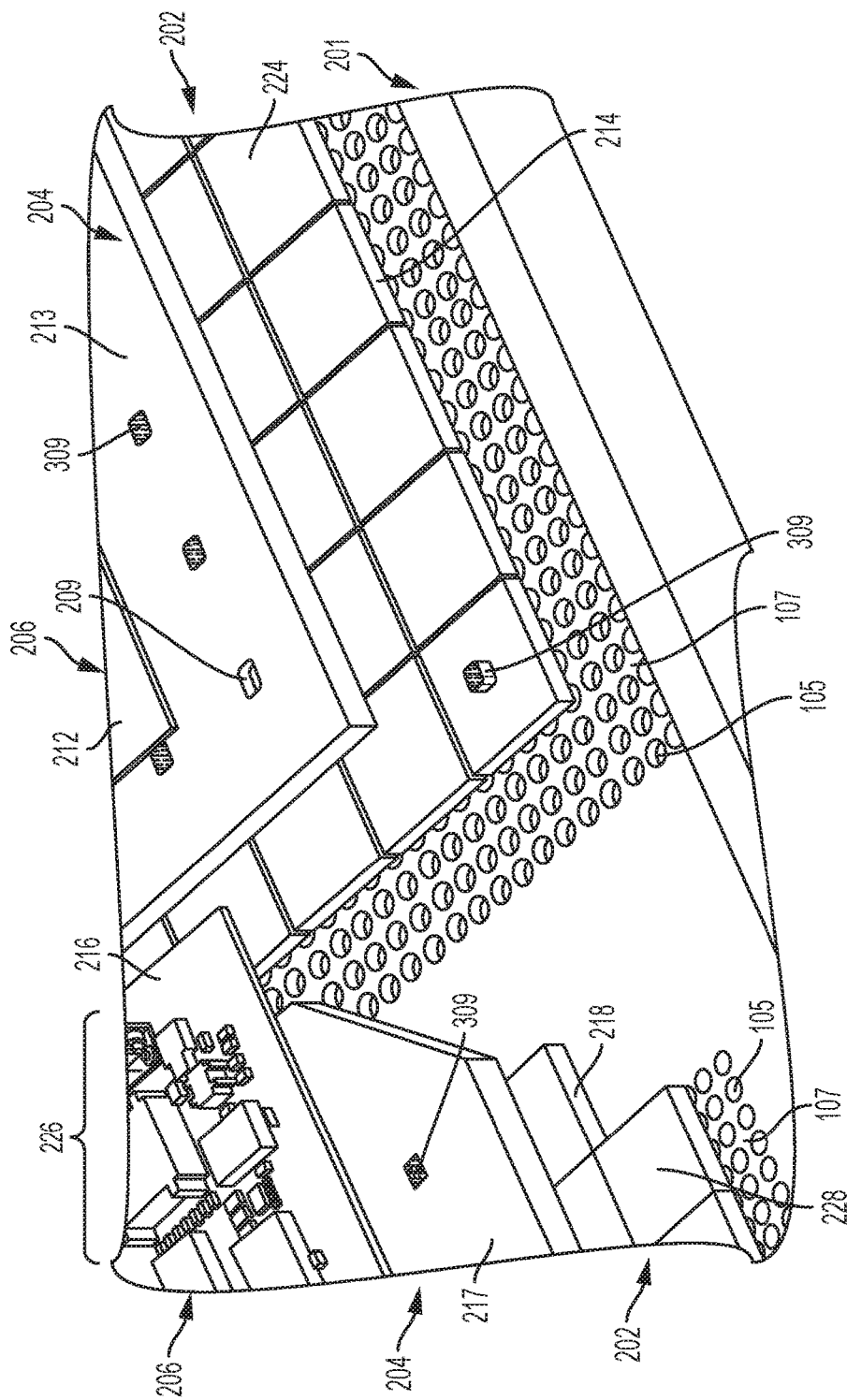
FIG. 3 illustrates an exploded view of an antenna integrated printed wiring board (AiPWB) interface to an array distribution printed wiring board (PWB) in accordance with an embodiment of the disclosure.

FIG. 3 illustrates an exploded view of an antenna integrated printed wiring board (AiPWB) interface to an array distribution printed wiring board (PWB) in accordance with an embodiment of the disclosure. As shown in FIG. 3, aperture assembly 201 incorporates metallic honeycomb structure 107 and the plurality of cylindrical waveguides 105 formed within metallic honeycomb structure 107, as described herein. Furthermore, FIG. 3 includes antenna array 202 with receive phased array antenna 214 and transmit phased array antenna 218. Receive phased array antenna 214 includes a plurality of receive subarray tile assembly 224 (e.g., receive antenna integrated printed wiring board) and transmit phased array antenna 218 includes a plurality of transmit subarray tile assembly 228 (e.g., transmit antenna integrated printed wiring board). Each of transmit subarray tile assemblies 228 and receive subarray tile assemblies 224 may be formed from an AiPWB (e.g., such as AiPWB 525 of FIG. 5), as described herein. Each of transmit subarray tile assemblies 228 and receive subarray tile assemblies 224 may include an interface connector 309 configured to provide an electrical interface to transmit array distribution PWB 216 and receive array distribution PWB 212, respectively.

For example, interface connector 309 may be coupled to transmit subarray tile assemblies 228. Interface connector 309 may extend through opening 209 in transmit cold plate 217 to couple to transmit array distribution PWB 216. In this regard, power and control circuit 226 of transmit array distribution PWB 216 may provide RF, DC power, and control signals to transmit subarray tile assembly 228 through interface connector 309. Interface connector 309 may be coupled to receive subarray tile assembly 224. Interface connector 309 may extend through opening 209 in receive cold plate 213 to couple to receive array distribution PWB 212. Furthermore, power and control circuit 229 of receive array distribution PWB 212 may provide provide RF, DC power, and control signals to receive subarray tile assembly 224 through interface connector 309.

Figure 4:
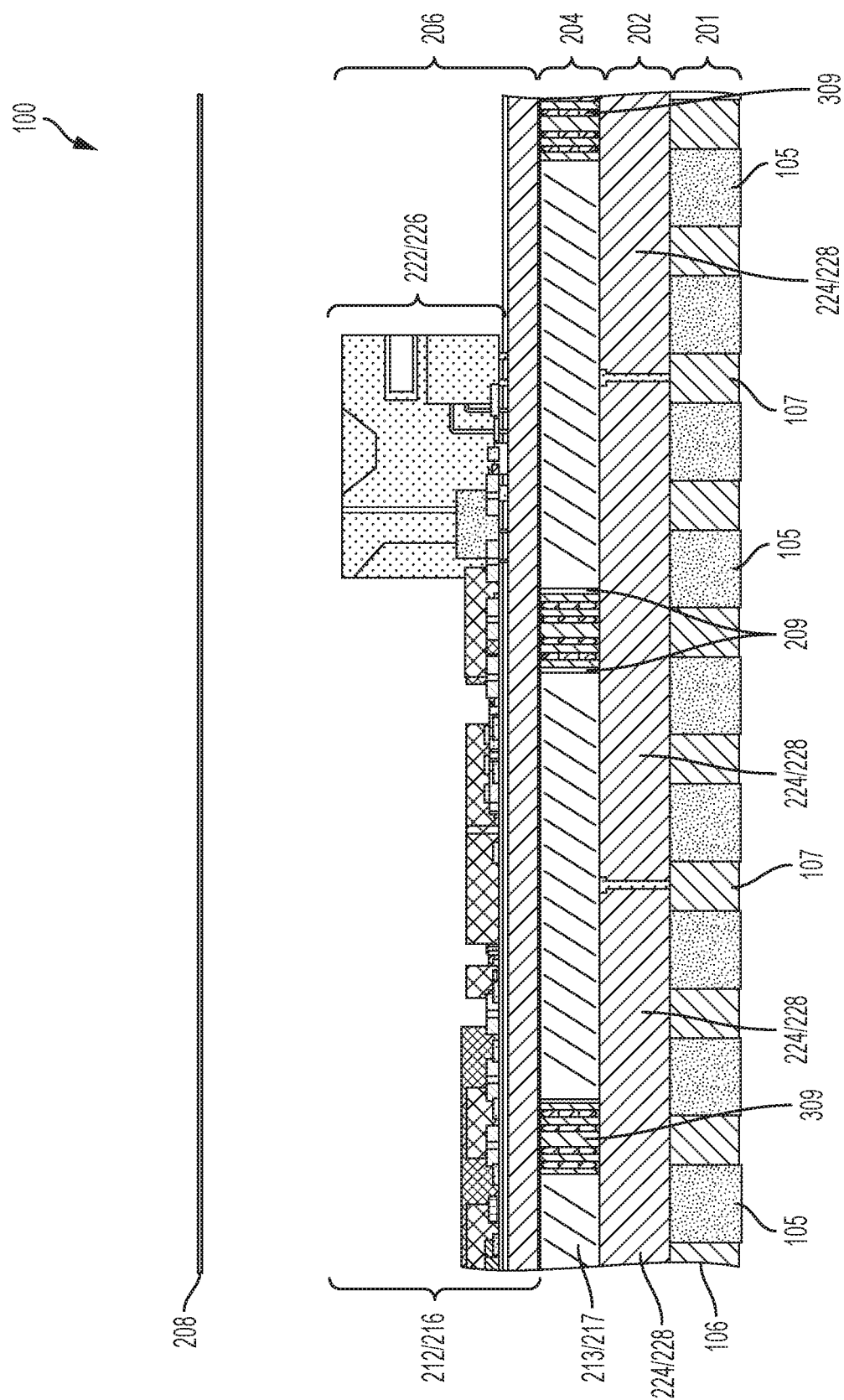
FIG. 4 illustrates a cross-section view of a phased array antenna system in accordance with an embodiment of the disclosure.

FIG. 4 illustrates a cross-section view taken at either line 4-4 or 4'-4' of the phased array antenna system 100 of FIG.

2 in accordance with an embodiment of the disclosure. For example, FIG. 4 shows a plurality of phased array antenna subarray tile assemblies 224/228 formed from AiPWB 525 and an aperture housing 106 including a plurality of waveguides 105 coupled to the plurality of subarray tile assemblies 224/228. Array distribution printed wiring board 212/216 may be coupled to the plurality of subarray tile assemblies. Cold plate 213/217 may be disposed between array distribution PWB 212/216 and the plurality of subarray tile assemblies 224/228.

In the embodiment shown in FIG. 4, interface connector 309 may extend through opening 209 in cold plate 213/217 to couple to array distribution PWB 212/216. Power and control circuit 222/226 of array distribution PWB 212/216 may provide RF, DC power, and control signals to subarray tile assembly 224/228 through interface connector 309.

Aperture housing 106 may include a metallic honeycomb structure 107 and a plurality of cylindrical waveguides 105 formed within metallic honeycomb structure 107. Cylindrical waveguides 105 may be coupled to subarray tile assembly 224/228 to provide a propagation path for RF signals received and/or transmitted by subarray tile assembly 224/228, as described herein.

In some embodiments, phased array antenna system 100 uses a similar structured approach for both transmit and receive antenna subsystems 211 and 215, respectively. This structured approach to construction and integration of the subarray tile assemblies 224/228 allows for growth of the array in an XY Cartesian coordinate planar direction.

FIG. 5 illustrates details of the AiPWB 525 of FIG. 4 in accordance with an embodiment of the disclosure. As shown, subarray tile assembly 202 includes a printed wiring board (PWB) 525 (e.g., AiPWB) including a plurality of layers 527/529, a plurality of integrated circuit die 540 (individually labeled as 540a through 540d) coupled to a first surface 503 of the PWB 525, and a plurality of antenna elements (e.g., such as antenna elements 660 of FIG. 6) coupled to a second surface 504 of PWB 525.

In some embodiments, AiPWB 525 may be fabricated from a radio frequency (RF) compatible dielectric material using pre-pregs/copper core. The upper three layers (e.g., layers one through three) of AiPWB 525 may form a first subset of layers 527. In some embodiments, layers 527 may be formed from thin pre-pregs/copper and include a plurality of first conductive vias 510 (individually labeled as 510a through 510f) extending through the layers 527 to provide for improved dimensional accuracy and direct attach of die with fine pitch solder bumps. In some embodiments, a plurality of solder bumps 541 (individually labeled as 541a through 541d) of integrated circuit die 540 may be spaced at 300 micrometer pitch. Routing between solder bumps 541 may require four millimeter traces and 4 millimeter spaces. By using thin pre-pregs/copper for layers 527, AiPWB 525 may accommodate the pitch, trace, and space requirements to attach and electrically connect integrated circuit die 540 to AiPWB 525. In this regard, first conductive via 510 (e.g., a laser drilled microvia) having a first diameter may be coupled to integrated circuit die 540 and extend through layers 527.

The lower twenty layers (e.g., layers four through twenty-three) of AiPWB 525 may form a second subset of layers 529. In some embodiments, a plurality of second conductive vias 520 (individually labeled as 520a through 520f) may extend through layers 529. In some embodiments, pre-pregs/copper used for layers 529 may be thicker than pre-pegs/copper used for layers 527 to accommodate larger diameter vias. In this regard, second conductive via 520 (e.g., a plated via having a larger diameter than laser drilled microvia) having a second diameter larger than the first diameter, and offset from first conductive via 510, may extend through second layers 529, and may couple to antenna element 660. A plurality of conductive traces (individually labeled as 530a through 530f) of AiPWB 525 may couple the plurality of first conductive vias 510 to the plurality of second conductive vias 520 on a common layer to electrically couple integrated circuit die 540 to antenna element 660.

Second conductive via 520 may be offset from first conductive via 510 to provide for a thermal and mechanical stress relief to integrated circuit die 540. Mechanical and thermal stress may cause failure at the integrated circuit die solder bump 541 to first conductive via 510 solder joint due to coefficient of thermal expansion (CTE) mismatch in configurations where a coupled larger conductive via is not offset. Therefore, offsetting second conductive via 520 and incorporating conductive trace 530 decouples strain to the solder joint allowing for a robust and highly reliable electrical connection.

In some embodiments, an interposer printed wiring board (PWB) 560 (individually labeled as 560a through 560d) may couple integrated circuit die 540 to AiPWB 525. Interposer PWB 560 may provide adaptability in connecting integrated circuit die 540 of differing die geometries and/or input/output pin assignments to a common AiPWB 525 pad pattern. Furthermore, interposer PWB 560 may provide for an efficient thermal sink for integrated circuit die 540 thereby increasing thermal cycling reliability of integrated circuit die 540. For example, integrated circuit die 540 may be a flip chip including a plurality of solder bumps 541. The plurality of solder bumps 541 may be electrically and mechanically coupled to a first surface 507 of interposer PWB 560. Integrated circuit die 540 may be bonded to interposer PWB 560 and an underfill material 543 may be applied in an area 507a between the first surface 608 of integrated circuit die 540 and first surface 507 of interposer PWB 560. A second surface 508 of interposer PWB 560 may include a ball grid array (BGA) 561 (individually labeled as 561a through 561d) coupled to first surface 503 of AiPWB 525 and at least one of balls 561 in the BGA is electrically coupled to first conductive via 510.

In some embodiments, AiPWB 525 may include a plurality of ground vias 550 extending through layers 529. Ground via 550 may be fabricated as a plated through hole and distributed about a perimeter around second conductive via 520 to provide a waveguide cage (e.g., such as waveguide cage 651 of FIG. 6) around second conductive via 520, as described herein. Ground via 550 may be backdrilled as shown by backdrill 535a to remove un-used section of ground via 550. Backdrill 535 (individually labeled as 535a through 535d) minimizes signal stubs and reduces the number of parasitic signals.

In some embodiments, aperture housing 106 may include a metallic honeycomb structure 107. A plurality of cylindrical waveguides 105 may be formed within metallic honeycomb structure 107 to provide a propagation path for transmitted and received electromagnetic signals. In this regard, each cylindrical waveguide 105 may be formed with a radius substantially equal to a radius of AiPWB waveguide (e.g., such as AiPWB waveguide 601 of FIG. 6) and extends from a top surface 502 to a bottom surface 501 of metallic honeycomb structure 107. In some embodiments, recesses 516a and 516b may be formed along surface 505 and 506, respectively. In other embodiments, fewer or more recesses 516 may be formed.

In some embodiments, cylindrical waveguide 105 and recesses 516a and 516b may be filled with a dielectric material. The dielectric material may be chosen for properties that has low loss at RF frequencies and has a dielectric constant that is substantially equal to a dielectric constant of AiPWB 525. Furthermore, a dielectric material may be chosen for a coefficient of thermal expansion (CTE) substantially equal to a CTE of metallic honeycomb structure 107. The dielectric material may be formed within the cylindrical waveguide 105 opening using an injection molded or a compression molded process. In some embodiments, filled recesses 516a and 516b mechanically secures the dielectric material to cylindrical waveguide 105 to prevent thermal and/or mechanical stresses from causing dielectric material to shift within waveguide 105. Metallic honeycomb 107 may be coupled to AiPWB 525 at surface 504 and each cylindrical waveguide 105 may be coupled to corresponding ones of the plurality of AiPWB waveguides 601.

In some embodiments, wide angle impedance match (WAIM) layers of material 563 may be disposed on cylindrical waveguides 105 to optimize an impedance match between phased array antenna system 100 and free space to permit scanning of phased array antenna system 100 to a wide angle. In this regard, a plurality of wide angle impedance match (WAIM) layers of material 563 may be disposed on an exposed surface 509 of the plurality of cylindrical waveguides 105 and an outer surface 501 of metallic honeycomb structure 107.

In some embodiments, AiPWB 525 may include a cover and seal ring 512 to provide environmental contamination protection and EMI shielding. Cover and seal ring 512 may be formed with individual cavities to provide each integrated circuit die 540 an enclosure to reduce EMI and maintain antenna performance in a compact AiPWB 525 volume.

As shown in FIG. 5, AiPWB 525 is an integration of a variety of technologies to increase performance and functionality while reducing cost, size, weight and power of a scalable building block that may vary sub-array dimension and footprint to optimize fabrication, assembly, manufacturability and test of the integrated phased array antenna system 100.

Figure 6:
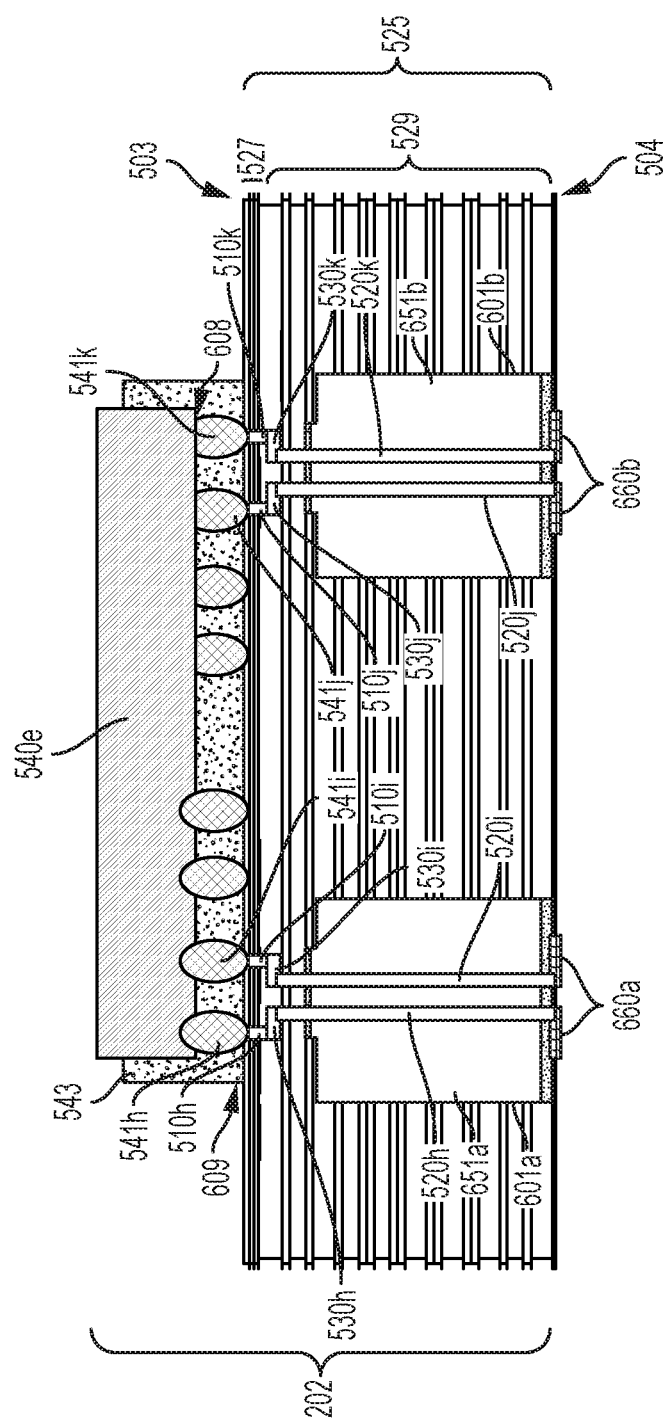
FIG. 6 illustrates a cross-section view of an integrated circuit die connection to antenna elements through an AiPWB in accordance with an embodiment of the disclosure.

FIG. 6 illustrates details of the AiPWB 525 of FIG. 4 in accordance with another embodiment of the disclosure. FIG. 6 provides various features of FIG. 4 previously discussed herein that may form a part of the present embodiment. In particular, FIG. 6 illustrates a cross-section view of an integrated circuit die 540 connection to antenna elements 660 through an AiPWB 525 in accordance with an embodiment of the disclosure.

In the embodiment shown in FIG. 6, AiPWB 525 may include an AiPWB waveguide 601 (individually labeled as 601a through 601b). AiPWB waveguide 601 may be formed by a plurality of plated through hole vias (e.g., ground vias 550) extending from layers 529 to a bottom surface 504 to form a waveguide cage 651 within AiPWB 525, as described herein. AiPWB waveguide 601 may include antenna element 660 configured to receive and/or transmit RF signals.

In some embodiments, integrated circuit die 540e may be configured as a flip chip including a plurality of solder bumps 541 (individually labeled as 541h through 541k) electrically and mechanically coupled to first surface 503 of AiPWB 525. Integrated circuit die 540e may be adhesively bonded to first surface 503 of AiPWB 525 and underfill material 543 may be applied between surface 503 of AiPWB 525 and surface 608 of integrated circuit die 540e. In some embodiments, underfill 543 may be applied using a liquid capillary flow process. In other embodiments, underfill 543 may be applied using a fluxing process, however, other processes used to apply underfill 543 are possible. At least one of the solder bumps 541 may be electrically coupled to first conductive via 510 extending through layers 527.

Second conductive via 520 (individually labeled as 520h through 520k) may be offset from first conductive via 510, and may extend through a second subset of layers 529 to couple to antenna element 660 (e.g., 660a and 660b). Conductive trace 530 (individually labeled as 530h through 530k) of AiPWB 525 may couple the first and second vias on a common AiPWB layer. Second conductive via 520 may be offset from first conductive via 510 to provide for a thermal and mechanical stress relief to integrated circuit die 540e, as described herein.

In some embodiments, antenna element 660 may be configured to provide orthogonal RF signals. In this regard, integrated circuit die 540e may select a polarization (e.g., linear polarization, right hand circular polarization, or left hand circular polarization) of the RF signals received from antenna element 660a and/or 660b, as described herein.

Figure 7:
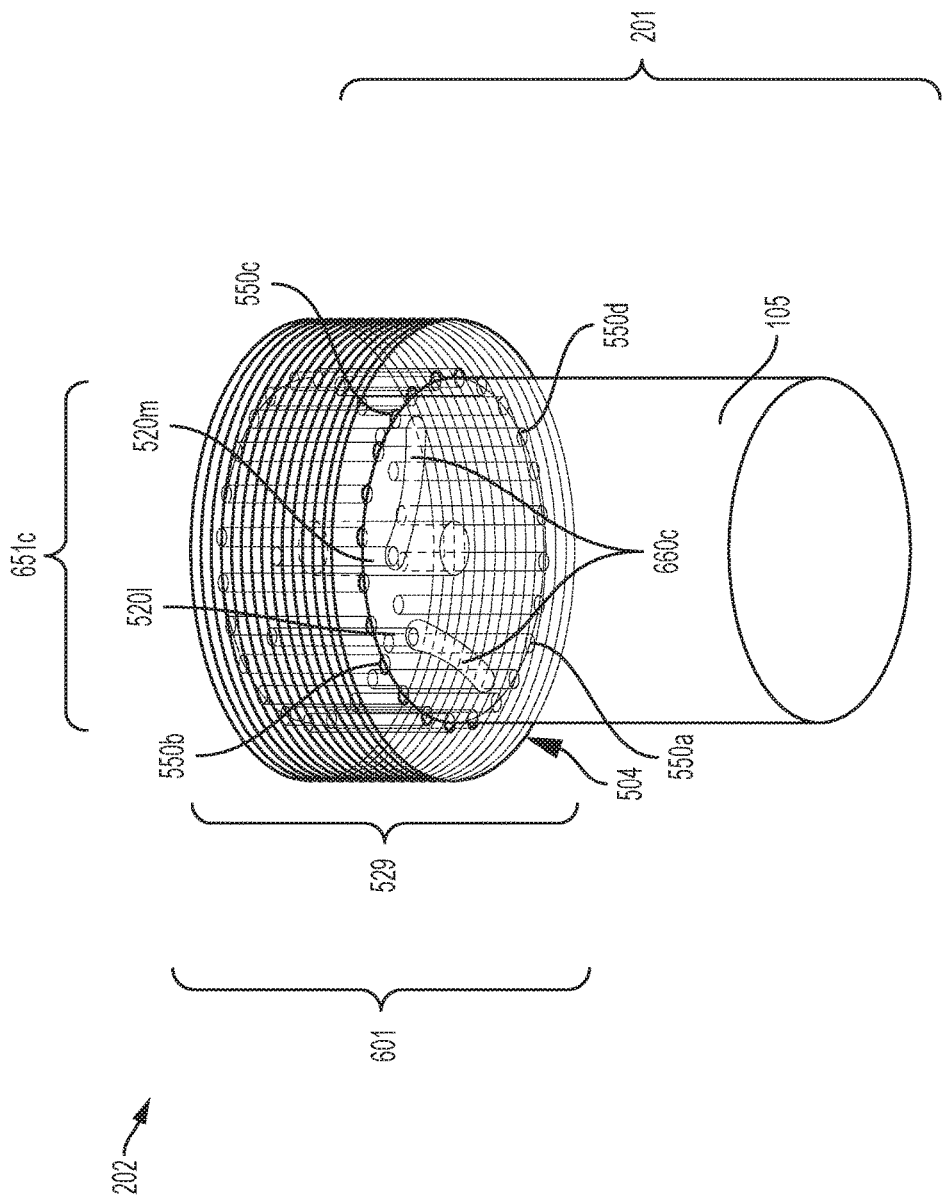
FIG. 7 illustrates a view of an AiPWB waveguide coupled to a cylindrical waveguide in accordance with an embodiment of the disclosure.

FIG. 7 illustrates a view of the AiPWB waveguide 601 coupled to the cylindrical waveguide 105 in accordance with an embodiment of the disclosure. FIG. 7 provides various features of FIG. 4 previously discussed herein that may form a part of the present embodiment. Cylindrical waveguide 105 is unshaded and transparent in FIG. 7 to show additional features of AiPWB waveguide 601. AiPWB waveguide 601 may be formed within layers 529 of AiPWB 525. In some embodiments, twenty-four ground vias 550 may extend through layers 529 and may be distributed about a perimeter around second conductive via 520 (individually labeled as 520l through 520m) to provide a waveguide cage 651c around second conductive via 520. Second conductive via 520 may extend through layers 529 and electrically couple to antenna element 660c disposed on bottom surface 504 of AiPWB 525. Cylindrical waveguide 105 may be coupled to waveguide cage 651c at a bottom surface 504 of AiPWB 525. In this regard, a subarray tile assembly waveguide may be formed from AiPWB waveguide 601 coupled to cylindrical waveguide 105.

Ground vias 550 (individually labeled as 550a through 550d) may be re-used on layers 529 to attenuate radio frequency interference (RFI) within RF distribution circuits formed on layers between the interstitial regions of AiPWB waveguide 601, as described herein. By re-using vias, a reduction in total via count within a sixty-four antenna element subarray tile assembly may provide for a less complex and more cost effective AiPWB 525. For example, by re-using ground vias 550, AiPWB 525 via count may be reduced by approximately one thousand five hundred vias.

Figure 8:
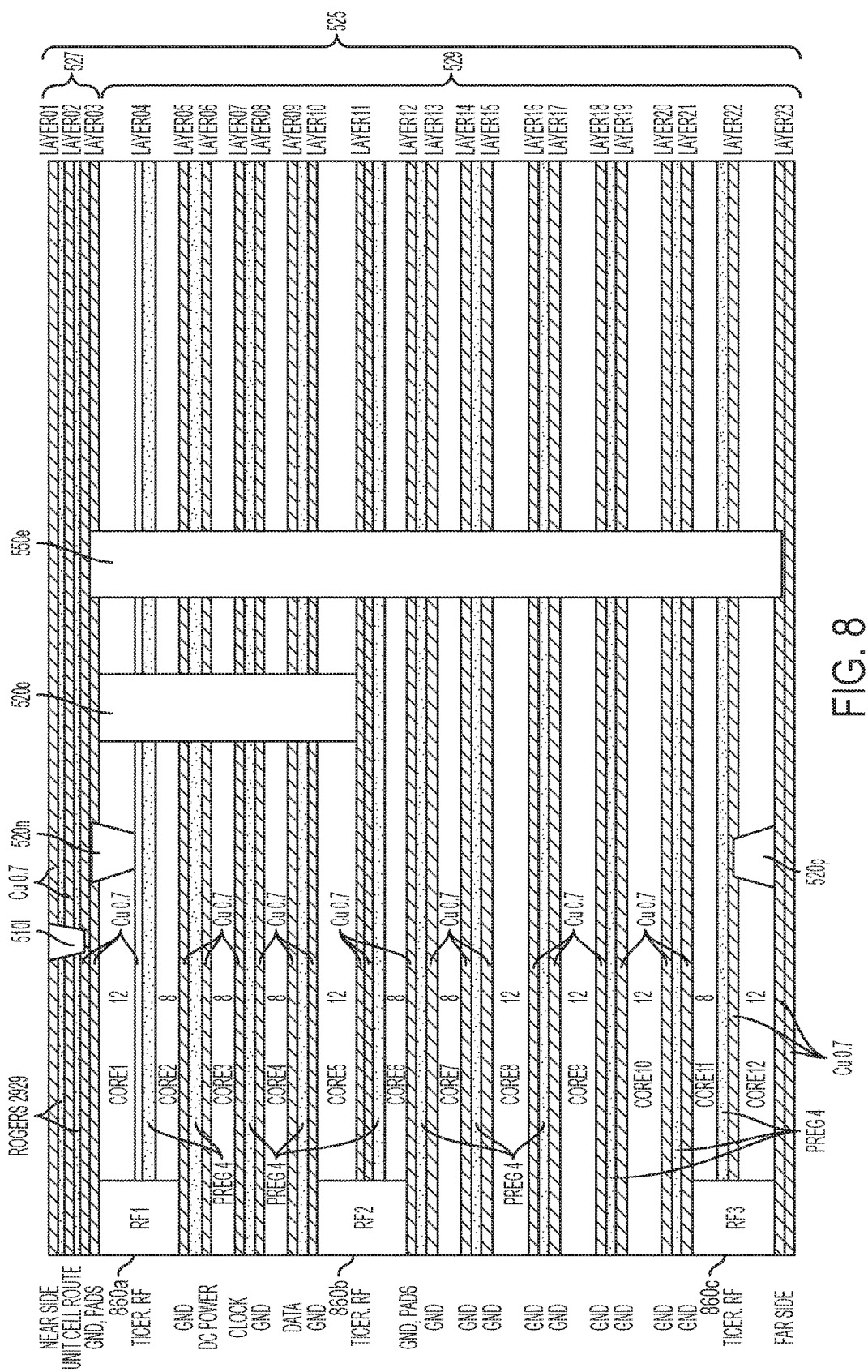
FIG. 8 illustrates a cross-section view of an AiPWB in accordance with an embodiment of the disclosure.

FIG. 8 illustrates details of the AiPWB of FIG. 4 in accordance with yet another embodiment of the disclosure. FIG. 8 provides various features of FIG. 4 previously discussed herein that may form a part of the present embodiment. In some embodiments, as shown in FIG. 8, AiPWB 525 includes 23 metal layers (e.g., a combination of first layers 527 and second layers 529). In some embodiments, the metal layers are copper, however other metals used for microwave frequency applications may be possible. AiPWB may also include a plurality of dielectric layers. Dielectric layers may be formed using a dielectric material with a dielectric constant appropriate for microwave frequency applications. In some embodiments, Rogers 2929 Bondply available from Rogers Corporation of Brooklyn Conn. may be used in the construction of AiPWB 525. The plurality of metal layers and dielectric layers used to form AiPWB 525 may require only two lamination sequences using industry standard PWB processing techniques. Conventional PWBs may require three or more lamination sequences. AiPWB 525 may require approximately four thousand vias compared to approximately thirty-eight thousand vias required for conventional phased array antenna printed wiring boards. In this regard, these improvements over conventional processes and techniques provide for a significant reduction in AiPWB fabrication costs. As shown in FIG. 8, first conductive via 510*l* may be formed on layers 527. Second conductive via 520 (individually labeled as 520*n* through 520*p*) may be formed on layers 529.

AiPWB 525 may include RF distribution layers 860 (individually labeled as 860*a* through 860*c*) formed within layers 529 of AiPWB 525 to provide for an RF distribution network within AiPWB 525. By implementing the RF distribution layers 860 within layers 529, ground via 550*e*, used for waveguide cage 651 extending through layers 529, may be re-used to reduce radio frequency interference within the RF distribution layers 860.

Figure 9:
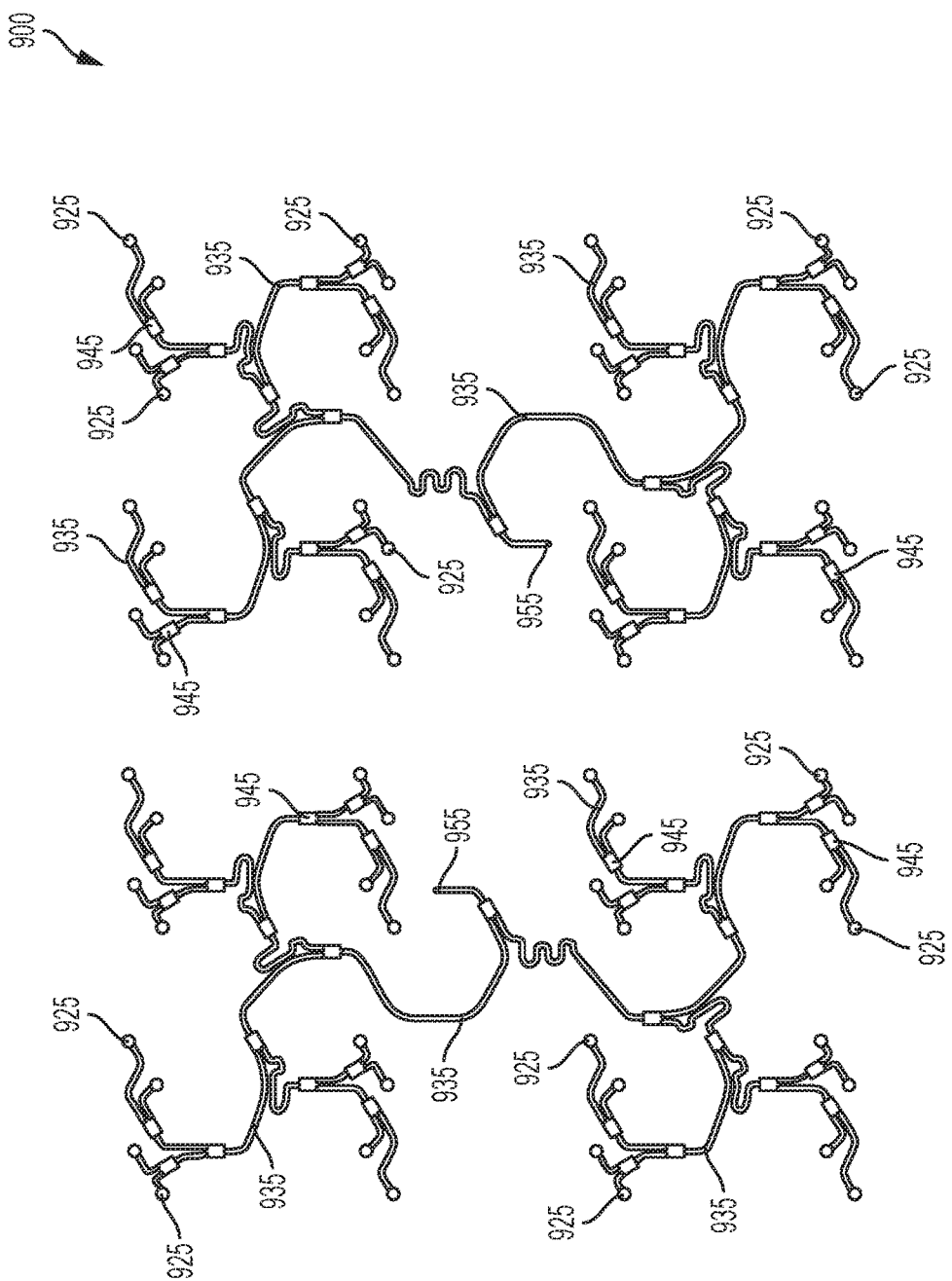
FIG. 9 illustrates a view of a RF distribution layer of an AiPWB in accordance with an embodiment of the disclosure.

FIG. 9 illustrates a view of an RF distribution layer 900 of the AiPWB 525 in accordance with an embodiment of the disclosure. In the embodiment shown in FIG. 9, RF distribution layer 900 may be configured on one or more of layers (e.g., RF distribution layers 860*a* through 860*c*) of AiPWB 525. RF distribution layer 900 may be implemented to combine a plurality of polarized RF signals (e.g., such as polarized RF signals 1102*a* and/or 1102*b* of FIG. 11C) to provide a single subarray tile assembly polarized RF signal. In this regard, RF distribution layer 900 may include a plurality of RF distribution vias 925 implemented to couple the plurality of polarized RF signals 1102*a* and/or 1102*b* to a plurality of conductive traces 935 formed on RF distribution layer 900. In some embodiments, the plurality of conductive traces 935 may be formed as controlled impedance conductive traces 935 (e.g., 50 ohm controlled impedance traces and/or 100 ohm controlled impedance traces) configured to provide pairs of polarized RF signals 1102*a* and/or 1102*b* to a combiner circuit 945. In some embodiments, controlled impedance conductive traces 935 may be configured as stripline conductors, however, other types of conductors are possible, such as embedded microstrip. Successively combined pairs of polarized RF signals 1102*a* and/or 1102*b* may be further combined to provide a single combined polarized RF signal 1102 at via 955 of RF distribution layer 900.

Figure 10A:
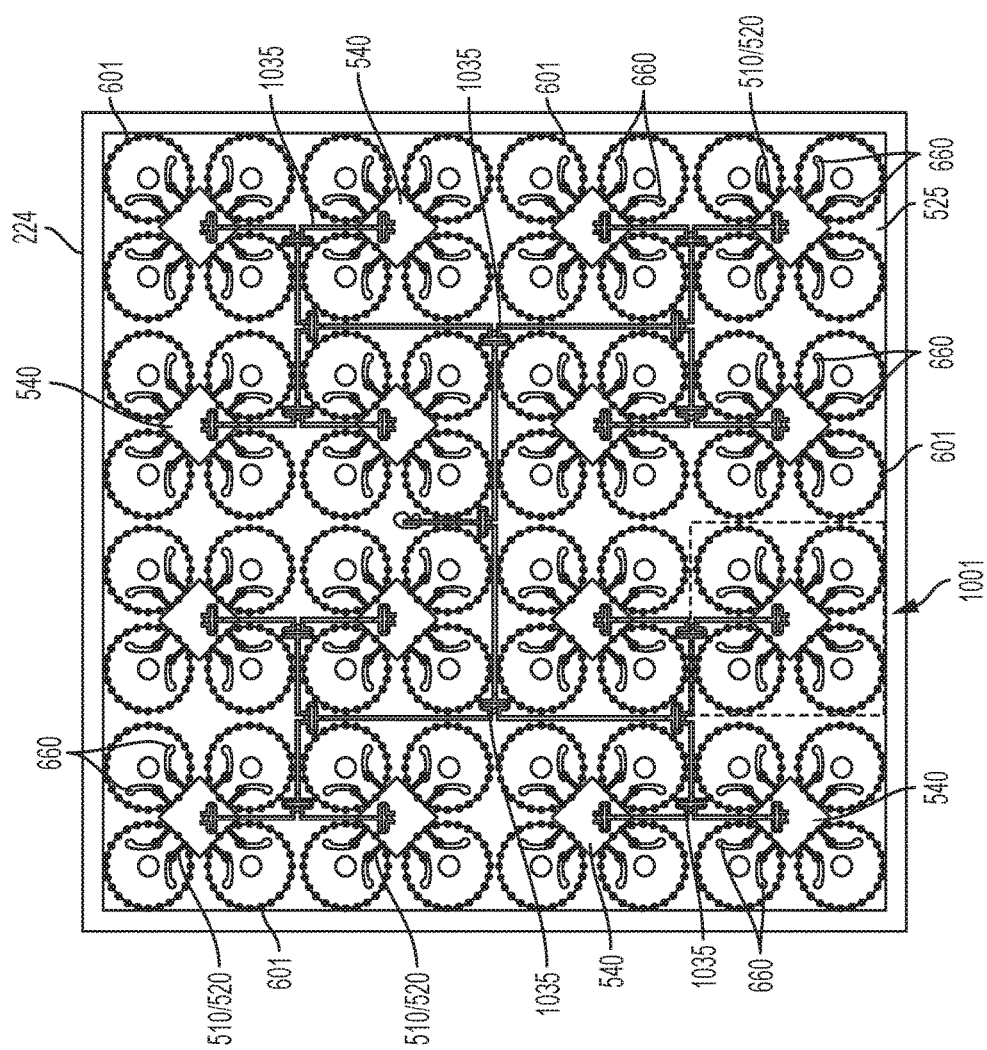
FIG. 10A illustrates a view of a subarray tile assembly in accordance with an embodiment of the disclosure.

FIG. 10A illustrates a view of a subarray tile assembly (e.g., receive subarray tile assembly 224 and/or transmit subarray tile assembly 228) in accordance with an embodiment of the disclosure. In the embodiment shown in FIG. 10A, subarray tile assembly may be implemented as a sixty-four antenna element receive subarray tile assembly 224 including an AiPWB 525, and a plurality of integrated circuit die 540 coupled to a plurality of antenna elements 660 arranged in an eight by eight square lattice. In the embodiment shown, four antenna elements 660 are arranged in a square lattice gird 1001 and each of the four antenna elements 660 are coupled to integrated circuit die 540. First and second conductive vias (e.g., 510 and 520, respectively) may couple integrated circuit die 540 to each of four antenna elements 660 to receive RF signals from antenna elements 660. RF distribution conductors 1035 may electrically couple integrated circuit die 540 polarized RF signals 1102*a* and/or 1102*b* to RF distribution layer 900. In some embodiments, RF distribution conductors 1035 may be configured as stripline conductors, however, other types of conductors are possible, such as microstrip. In other embodiments, RF distribution conductors 1035 may be coaxial cables. RF distribution layer 900 may combine the plurality of polarized RF output signals 1102*a* and/or 1102*b* to form a single combined polarized RF signal 1102 and provide the single combined polarized RF signal 1102 to array distribution assembly 206 of phase array antenna assembly 100 for beamsteering operations.

Figure 10C:
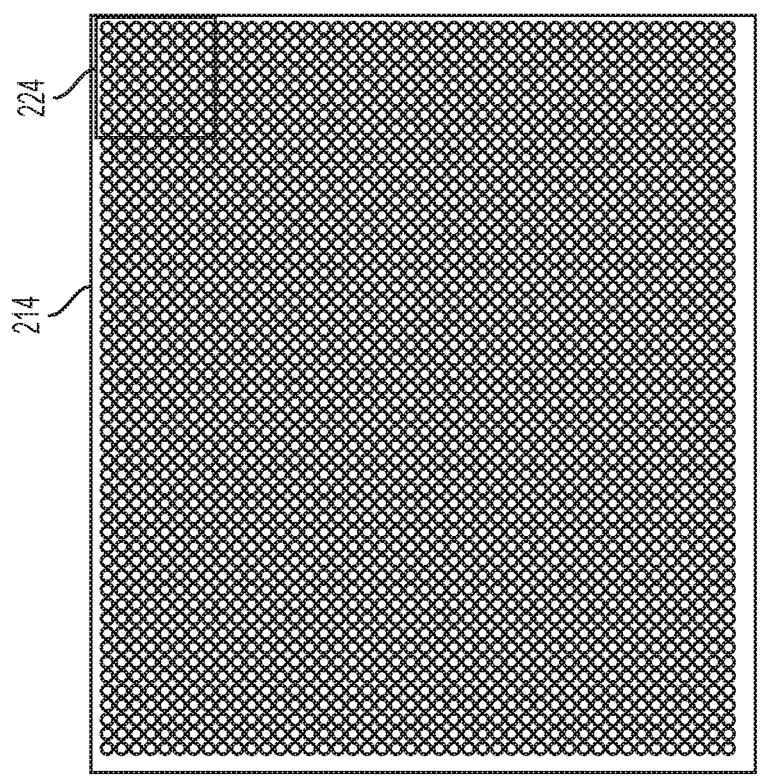
FIG. 10C illustrates a view of a receive phased array antenna in accordance with an embodiment of the disclosure.
Figure 10B:
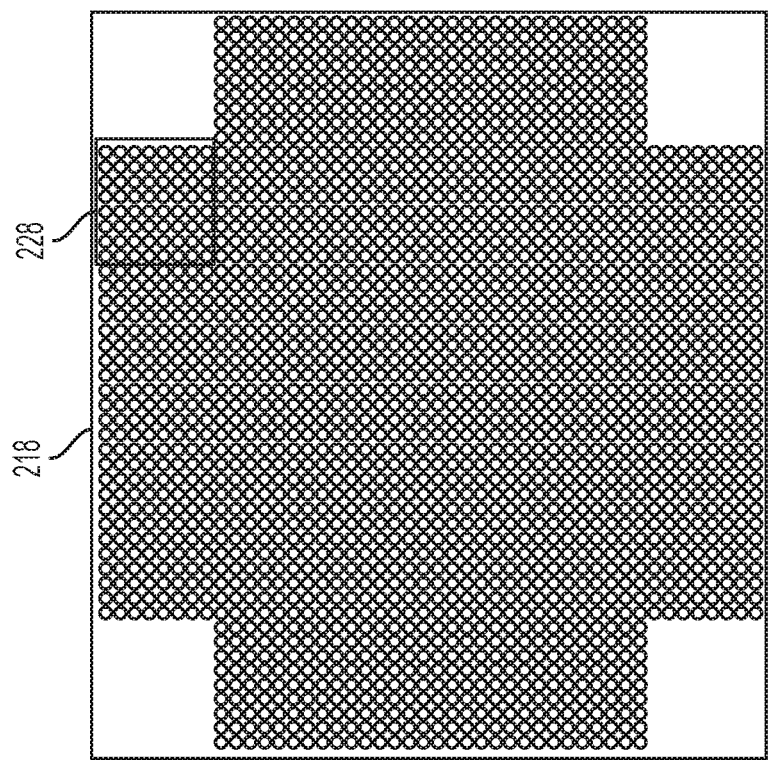
FIG. 10B illustrates a view of a transmit phased array antenna in accordance with an embodiment of the disclosure.

FIG. 10B illustrates a view of a transmit phased array antenna 218 in accordance with an embodiment of the disclosure. In the embodiment shown in FIG. 10B, transmit phased array antenna 218 includes thirty-two sixty-four antenna element transmit subarray tile assemblies 228. FIG. 10C illustrates a view of a receive phased array antenna 214 in accordance with an embodiment of the disclosure. In the embodiment shown in FIG. 10C, receive phased array antenna 214 includes forty-two sixty-four antenna element receive subarray tile assemblies 224. In this regard, the subarray tile assembly is the basic building block of phased array antenna system 100. Receive subarray tile assemblies 224 and transmit subarray tile assemblies 228 provide a scalable tile assembly that can be replicated in an XY Cartesian coordinate planar direction to develop a larger integrated phased array aperture.

Figure 11B:
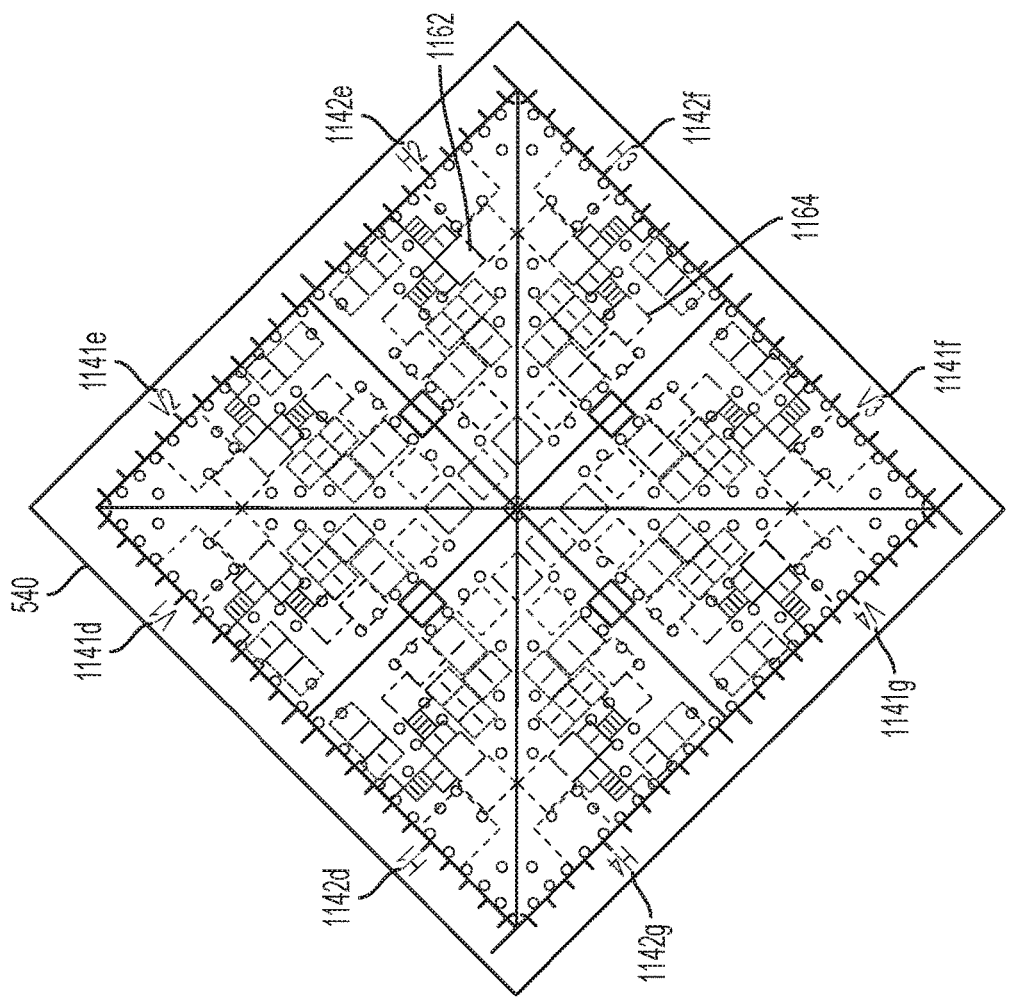
FIG. 11B illustrates an exploded view of an integrated circuit die in accordance with an embodiment of the disclosure.
Figure 11A:
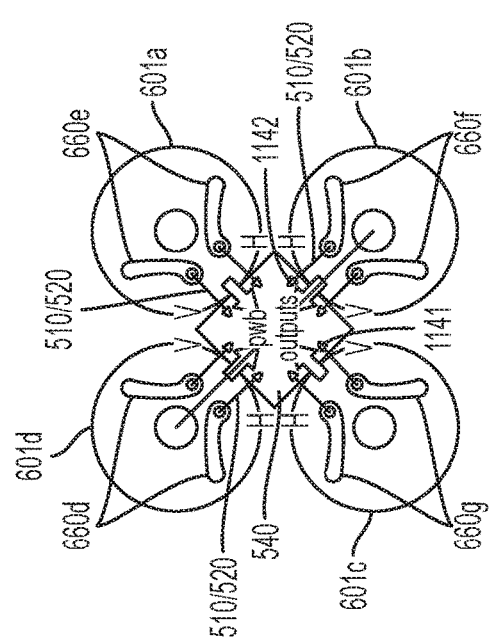
FIG. 11A illustrates integrated circuit die connections to antenna elements in accordance with an embodiment of the disclosure.

FIG. 11A illustrates integrated circuit die 540 connections to antenna elements 660 in accordance with an embodiment of the disclosure. In the embodiment shown in FIG. 11A, four antenna elements 660 (individually labeled as 660*d* through 660*g*) may be arranged in a square lattice grid (e.g., square lattice grid 1001). First and second conductive vias (e.g., 510 and 520, respectively) may couple integrated circuit die 540 to each of four antenna elements 660. In the embodiment shown, each antenna element 660*d* through 660*g* may provide a vertical RF signal to input port 1141 of integrated circuit die 540 and a horizontal RF signal to input port 1142 of integrated circuit die 540. Each of antenna element 660 vertical and horizontal RF signals may be coupled to integrated circuit die 540 through a corresponding first conductive via 510 and second conductive via 520.

FIG. 11B illustrates an exploded view of an integrated circuit die 540 in accordance with an embodiment of the disclosure. In some embodiments, integrated circuit die 540 may be fabricated from a silicon germanium alloy (SiGe) material. In other embodiments, integrated circuit die 540 may be fabricated from complementary metal-oxide semiconductor (CMOS), bipolar/complementary metal-oxide semiconductor (BiCMOS) or any other appropriate semiconductor technology used to fabricate RF circuits. By using SiGe, the area required on AiPWB 525 for integrated circuit die 540 may be reduced, thereby allowing for a square lattice 1001 implementation.

Integrated circuit die 540 may provide beamforming circuits for four antenna elements 660*d* through 660*g*. For example, FIG. 11B illustrates a receive subarray tile assembly 224 implementation of integrated circuit die 540 that includes vertical RF signal input ports 1141*d* through 1141*g* and horizontal RF signal input ports 1142*d* through 1142*g* corresponding to antenna elements 660*d* through 660*g*.

Figure 11C:
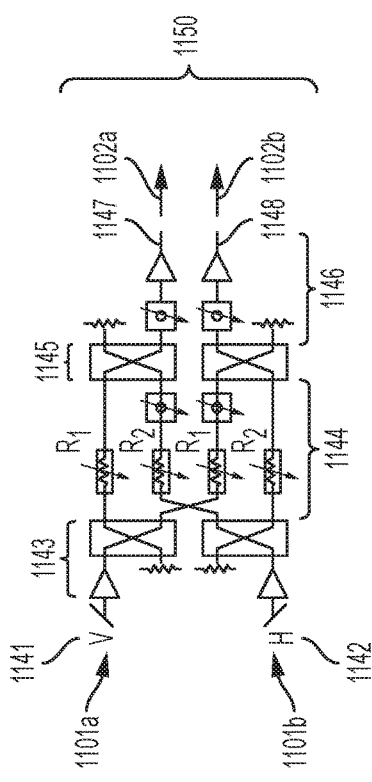
FIG. 11C illustrates receive element electronics in accordance with an embodiment of the disclosure.

FIG. 11C illustrates receive element electronics 1550 in accordance with an embodiment of the disclosure. Receive subarray tile assembly 224 implementation of integrated circuit die 540 includes four receive element electronics 1150 beamforming circuits. Vertical RF signal may be provided by antenna element 660 and may be received at input port 1141 of receive element electronics 1150. Vertical RF signal may be amplified and divided by splitter circuit 1143, set for polarization by polarization circuit 1144, combined by combiner circuit 1145, and phase shifted and amplified by beam direction circuit 1146. A vertical polarized RF signal may be provided at integrated circuit die 540 output 1147. In a similar manner, horizontal RF signal may be provided by antenna element 660 and may be received at input port 1142. Horizontal RF signal may be amplified and divided by splitter circuit 1143, set for polarization by polarization circuit 1144, combined by combiner circuit 1145, and phase shifted and amplified by beam direction circuit 1146. A horizontal polarized RF signal may be provided at integrated circuit die 540 output 1148.

Polarization circuit 1144 may selectively polarize vertical and horizontal RF signals. Polarization may be set for linear and/or circular polarizations. Circular polarizations may include a right hand circular polarization and a left hand circular polarization. In this regard, each of four receive element electronics 1150 of integrated circuit die 540 provides for two polarized RF signals 1102a and 1102b with independently selectable polarizations at receive element electronics output ports 1147 and 1148.

Figure 11D:
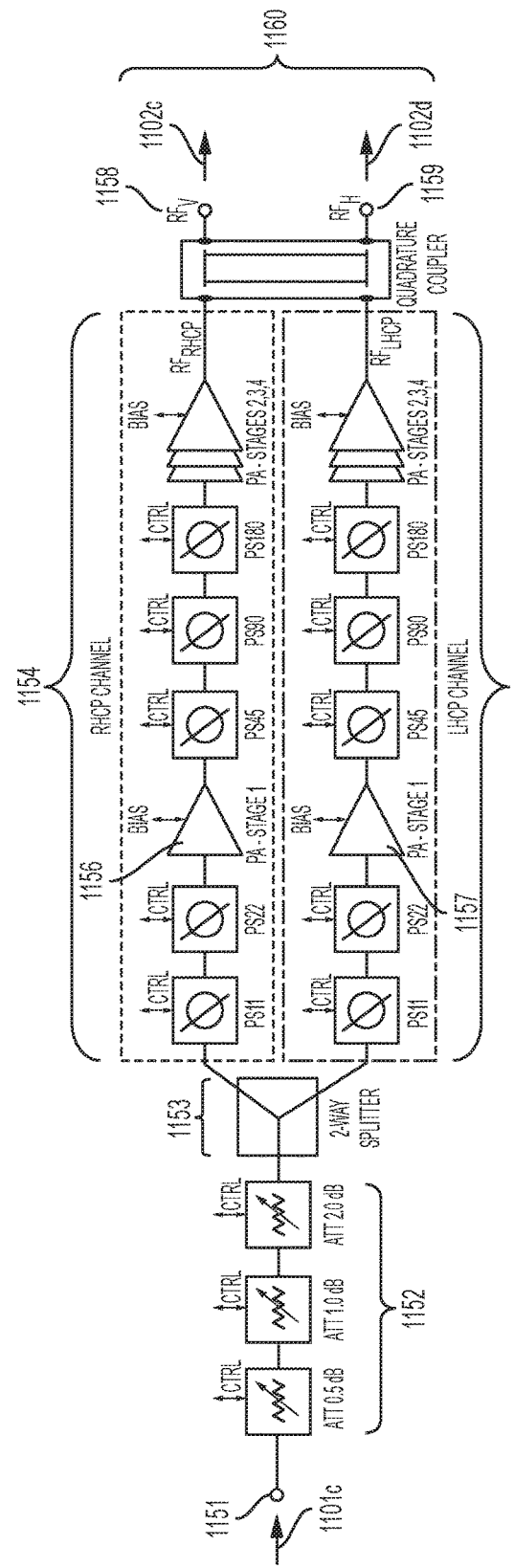
FIG. 11D illustrates transmit element electronics in accordance with an embodiment of the disclosure.

FIG. 11D illustrates a transmit element electronics 1160 in accordance with embodiments of the disclosure. Transmit subarray tile assembly 228 implementation of integrated circuit die 540 includes four transmit element electronics 1160 beamforming circuits. In some embodiments, an RF signal 1101c may be provided by RF converter 229 of array distribution assembly 206 and may be received at input port 1151 of transmit element electronics 1160. RF signal 1101c may be attenuated by variable attenuation circuit 1152, divided into two RF signals by splitter circuit 1153 and polarized by right hand circular polarization circuit 1154 and/or left hand circular polarization circuit 1155.

Transmit element electronics 1160 may be configured to transmit right hand circular polarized (RHCP) RF signals 1102c and 1102d at transmit element electronics output ports 1158 and 1159, respectively. In some embodiments, transmit element electronics 1160 may transmit RHCP when left hand circular polarization driver stage 1157 is turned off.

Transmit element electronics 1160 may be configured to transmit left hand circular polarized (LHCP) RF signals 1102c and 1102d at transmit element electronics output ports 1158 and 1159, respectively. In some embodiments, transmit element electronics 1160 may transmit LHCP when RHCP driver stage 1156 is turned off. A matched load at output ports 1158 and 1159 may be maintained when driver stages 1156 and 1157 are selectively turned off during LHCP and RHCP operations, respectively.

In some embodiments, when all driver stages (e.g., LHCP and RHCP driver stages) are turned on and fully-biased, transmit element electronics 1160 transmits arbitrary linear polarized RF signals 1102c and 1102d at transmit element electronics output ports 1158 and 1159, respectively, with the orientation depending on the relative phase-shift of the RHCP and LHCP signals.

Figure 12A:
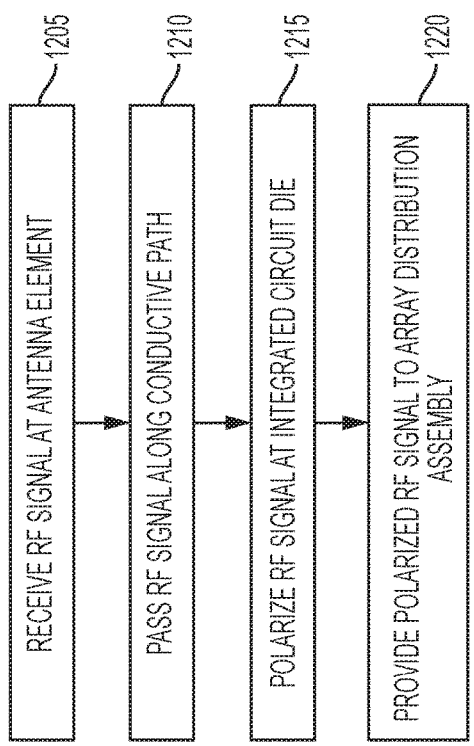
FIG. 12A illustrates a process of using a receive subarray tile assembly in accordance with an embodiment of the disclosure.

FIG. 12A illustrates a process of using a phased array antenna 100 receive subarray tile assembly 224 in accordance with an embodiment of the disclosure.

In block 1205, a plurality of RF signals 1101 (e.g., 1101a and 1101b) may be received by a plurality of antenna elements 660. In block 1210, each antenna element 660 may be configured to provide RF signals 1101a and 1101b to integrated circuit die 540 through corresponding ones of second conductive vias 520 and first conductive vias 510. RF signals 1101a and 1101b may be passed from antenna element 660 along a conductive path comprising a second conductive via 520, a conductive trace 530, a first conductive via 510, and coupled to integrated circuit die 540.

In block 1215, RF signals 1101a and 1101b may be received at input ports 1141 and 1142, respectively, of integrated circuit die 540 and integrated circuit die 540 may be configured to convert RF signals 1101a and 1101b to polarized RF signals 1102a and 1102b. RF signals 1101a and 1101b may be selectively polarized to a right hand circular polarization, a left hand circular polarization and/or a linear polarization. In block 1220, integrated circuit die 540 may provide polarized RF signals 1102a and 1102b at output ports 1147 and 1148, respectively. Polarized RF signals 1102a and 1102b may be coupled to RF distribution layer 900 of AiPWB 525 to combine with a plurality of polarized RF signals 1102 within receive subarray tile assembly 224 to produce a single combined polarized RF signal 1102. Single combined polarized RF signal 1102 may be coupled to receive array distribution PWB 212 of phase array antenna assembly 100 to be used for beamsteering operations.

Figure 12B:
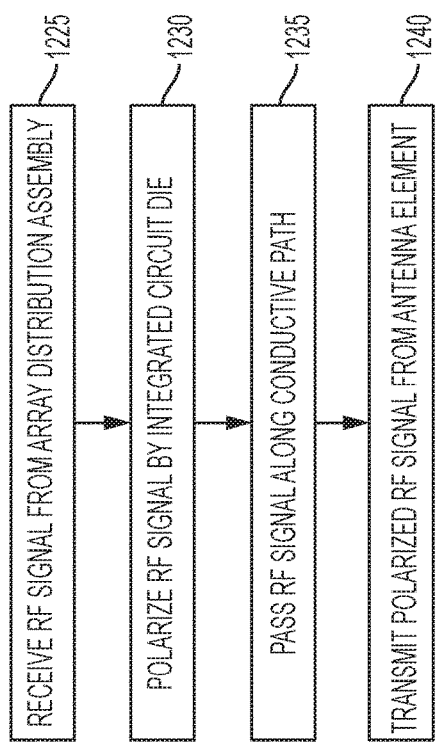
FIG. 12B illustrates a process of using a transmit subarray tile assembly in accordance with an embodiment of the disclosure.

FIG. 12B illustrates a process of using a phased array antenna 100 transmit subarray tile assembly 228 in accordance with an embodiment of the disclosure. In block 1225, an RF signal 1101c may be provided by RF converter 229 of array distribution assembly 206 and coupled to input port 1151 of integrated circuit die 540. In block 1230, RF signal 1101c may be divided into two RF signals and selectively polarized by integrated circuit die 540. Divided RF signals may be selectively polarized to a right hand circular polarization, a left hand circular polarization and/or an arbitrary linear polarization.

In block 1235, polarized RF signals 1102c and 1102d may be passed from integrated circuit die 540 output ports 1158 and 1159, respectively, along a conductive path comprising a first conductive via 510, a conductive trace 530, a second conductive via 520, and coupled to antenna element 660. In block 1240, antenna element 660 may transmit polarized RF signals 1102c and 1102d.

Figure 13:
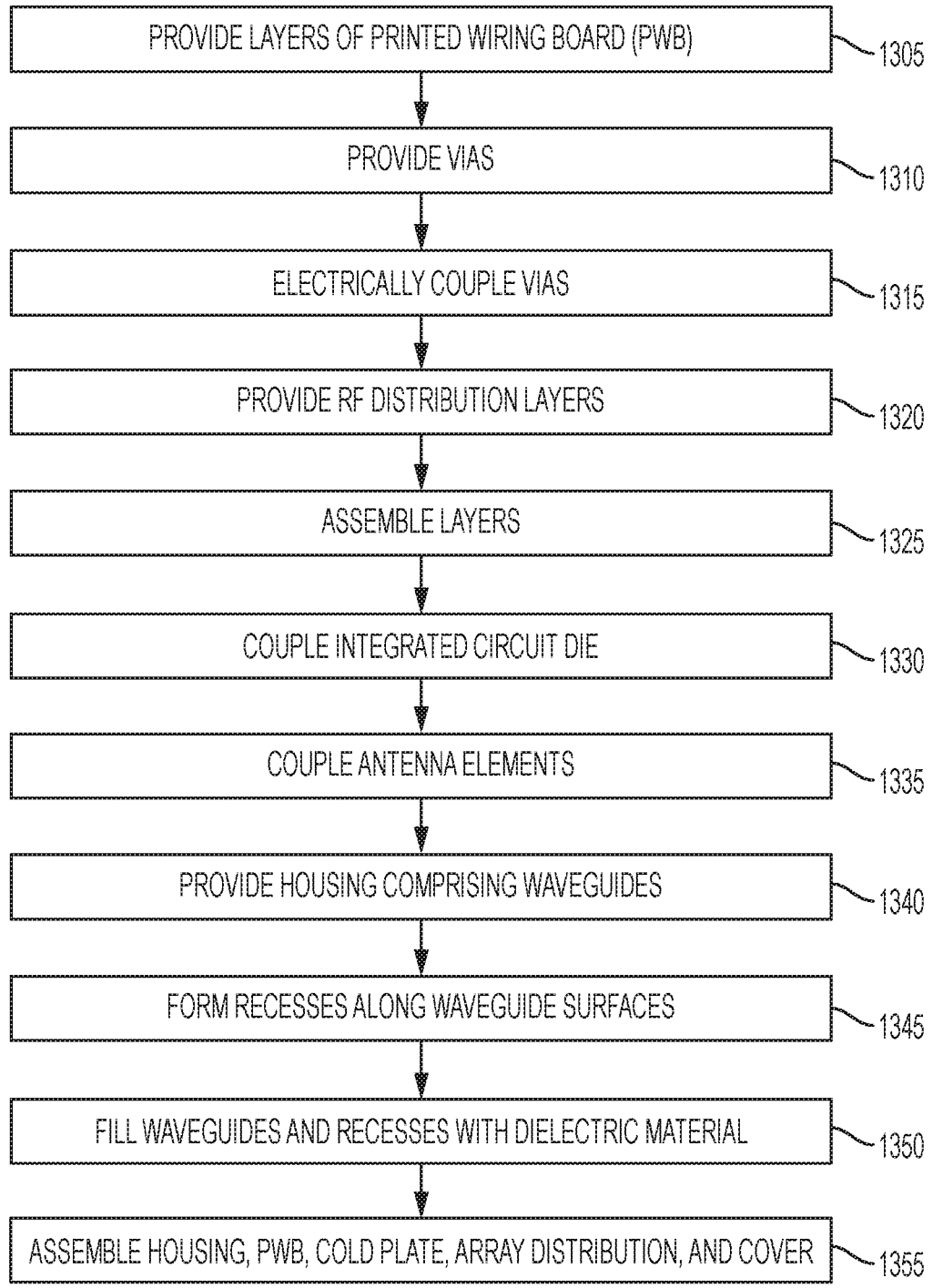
FIG. 13 illustrates a process of providing a phased array antenna subarray tile assembly in accordance with an embodiment of the disclosure.

FIG. 13 illustrates a process of providing a phased array antenna 100 subarray tile assembly (e.g., receive subarray tile assembly 224 and/or transmit subarray tile assembly 228) in accordance with an embodiment of the disclosure. In block 1305, a plurality of PWB 525 layers may be provided. In block 1310, a plurality of first conductive vias 510 may be formed within a first subset of the layers 527 and a plurality of second conductive vias 520 may be formed within a second subset of the layers 529. Second conductive via 520 may be offset from first conductive via 510 to provide a thermal mechanical stress relief to integrated circuit die 540. A plurality of ground vias 550 may be formed extending through the second subset of the layers 529 and distributed about a perimeter around second conductive via 520 to provide a waveguide cage 651 around second conductive via 520.

In block 1315, the plurality of first conductive vias 510 and second conductive vias 520 may be electrically coupled by a plurality of conductive traces 530 formed on PWB layers.

In block 1320, a plurality of RF distribution layers 900 may be provided including a plurality of RF distribution controlled impedance conductive traces 935 coupled to a plurality of combiner circuits 945 formed on layers 900. The plurality of ground vias 550, extending through RF distribution layers 900, may be re-used to reduce radio frequency interference within RF distribution circuits (e.g., RF distribution circuits formed by controlled impedance conductive traces 935 coupled to combiner circuits 945).

In block 1325, the plurality of PWB layers (e.g., first subset of layers 527 and second subset of layers 529) may be laminated to form AiPWB 525.

In block 1330, a plurality of integrated circuit die 540 may be adhesively bonded to AiPWB 525 and filled with underfill material 543 in an area 609 between integrated circuit die 540 first surface 608 and first surface 503 of AiPWB 525. A plurality of solder bumps 541 configured on a first surface 608 of integrated circuit die 540 may be mechanically coupled to first surface 503 of AiPWB 525. At least one of solder bumps 541 is electrically coupled to first conductive via 510 extending through first subset of the layers 527.

In some embodiments, integrated circuit die 540 may be coupled to a first surface 507 of an interposer printed wiring board (PWB) 560 and filled with underfill material 543 between surface 608 of integrated circuit die 540 and surface 507 of interposer PWB 560. A ball grid array 561 configured on a second surface 508 of interposer PWB 560 may be coupled to first surface 503 of AiPWB 525. At least one of balls 561 in the BGA is electrically coupled to first conductive via 510.

In block 1335, a plurality of antenna elements 660 may be coupled to a second surface 504 of AiPWB 525. Antenna elements 660 may be coupled to corresponding ones of second conductive vias 520. In block 1340, an aperture housing 106 may be provided including a plurality of cylindrical waveguides 105 formed within a metallic honeycomb structure 107 of aperture housing 106. Each cylindrical waveguide 105 has a radius that is substantially equal to a radius of a corresponding antenna element 660. The plurality of cylindrical waveguides 105 may be coupled to the plurality of antenna elements 660.

In block 1345, one or more recesses 516 (e.g., 516a and 516b) may be formed along surfaces 505 and 506 of each of the plurality of waveguides 105. In block 1350, the plurality of cylindrical waveguides 105 and one or more recesses 516 may be filled with a dielectric material configured with a dielectric constant that is substantially equal to a dielectric constant of AiPWB 525. In this regard, dielectric material may contact AiPWB 525 at second surface 504 and couple to antenna element 660 to provide for a continuous waveguide. Filled recesses 516 mechanically secure the dielectric material to waveguide 105.

In some embodiments, dielectric material may be molded in a shape substantially corresponding to the cylindrical waveguide 105 and recesses 516. Molded dielectric material may be placed into each of waveguides 105 to fill waveguides 105 and recesses 516. In some embodiments, dielectric material may be injected into each of waveguides 105 to fill waveguides 105 and recesses 516. The dielectric material may have a coefficient of thermal expansion (CTE) substantially equal to a CTE of metallic honeycomb structure 107.

In block 1355, aperture assembly 201, a plurality of AiPWBs 525 configured as receive subarray tile assembly 224 and transmit subarray tile assembly 228, cold plate assembly 204, array distribution assembly 206, and cover 208 may be assembled to form a phased array antenna system 100.

In view of the above discussion, it will be appreciated that a subarray tile assembly implemented in accordance with various embodiments set forth herein may be formed by integrating a variety of technologies to increase performance and functionality while reducing cost, size, weight and power. The subarray tile assembly is a scalable building block that utilizes a more cost-effective subarray size in order to achieve a large array size. AiPWB 525 incorporating SiGe integrated circuit die 540, antenna elements 660, microvias and plated vias offset from microvias to couple die 540 to antenna elements 660, RF distribution layers 900 with RF distribution circuits 935/945 formed within the interstitial regions of the AiPWB 525 waveguides 601, re-use of waveguide ground vias 550 to reduce radio frequency interference within RF distribution circuits 935/945, built-in test, and in-flight calibration all optimize fabrication, assembly, manufacturability and test of the integrated phased array antenna 100.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
   a phased array antenna subarray tile assembly comprising:
   a printed wiring board "PWB" comprising a plurality of layers;
   an integrated circuit die coupled to a first surface of the PWB;
   an antenna element coupled to a second surface of the PWB;
   a first conductive via having a first diameter, the first conductive via being coupled to the integrated circuit die and extending through a first subset of the layers;
   a second conductive via having a second diameter larger than the first diameter, the second conductive via being offset from the first conductive via, extending through a second subset of the layers, and being coupled to the antenna element;
   a conductive trace of the PWB coupled to the first and second conductive vias; and
   wherein the offset of the second conductive via provides a thermal mechanical stress relief to the integrated circuit die.

2. The system of claim 1, wherein the integrated circuit die is a flip chip comprising a plurality of solder bumps coupled to the first surface of the PWB, and wherein at least one of the solder bumps is electrically coupled to the first conductive via.

3. The system of claim 1, further comprising an interposer printed wiring board "PWB", wherein the integrated circuit die is a flip chip comprising a plurality of solder bumps coupled to a first surface of the interposer PWB, wherein a second surface of the interposer PWB comprises a ball grid array coupled to the first surface of the PWB, and wherein at least one of the balls is electrically coupled to the first conductive via.

4. The system of claim 1, wherein the integrated circuit die is configured to provide a polarized radio frequency "RF" signal passed to the antenna element through the first and second conductive vias.

5. The system of claim 4, further comprising:
   a plurality of the antenna elements;
   a plurality of the first and second conductive vias; and
   wherein the integrated circuit die is configured to provide the corresponding polarized RF signal passed to each of the antenna elements through corresponding ones of the first and second conductive vias.

6. The system of claim 1, further comprising:
   a built-in test circuit formed within the integrated circuit die;
   a controller coupled to the built-in test circuit;
   wherein the built-in test circuit is configured to provide a first test signal to the integrated circuit die and receive a second test signal from the integrated circuit die; and
   wherein the controller receives the second test signal to compare to a reference second test signal.

7. The system of claim 1, further comprising:
an in-flight calibration circuit formed within the integrated circuit die; and
wherein the in-flight calibration circuit is configured to adjust an operation of the system in response to a signal received through the first conductive via.

8. The system of claim 1, wherein the antenna element is configured to provide an RF signal passed to the integrated circuit die through the second and first conductive vias, and wherein the integrated circuit die is configured to convert the RF signal provided by the antenna element to a polarized RF signal.

9. The system of claim 8, further comprising:
a plurality of antenna elements;
a plurality of first and second conductive vias;
wherein each antenna element is configured to provide an RF signal passed to the integrated circuit die through corresponding ones of the second and first conductive vias; and
wherein the integrated circuit die is configured to convert the RF signal provided by each antenna element to a polarized RF signal.

10. The system of claim 1, further comprising:
a metallic honeycomb structure;
a plurality of cylindrical waveguides formed within the metallic honeycomb structure, wherein each cylindrical waveguide has a radius that is substantially equal to a radius of a corresponding antenna element;
a recess formed at an intermediate position along a surface of each of the cylindrical waveguides; and
wherein the cylindrical waveguides and the recesses are filled with a dielectric material, and wherein each filled recess mechanically secures the dielectric material to the cylindrical waveguide.

11. The system of claim 10, wherein:
the dielectric material has a coefficient of thermal expansion "CTE" substantially equal to a CTE of the metallic honeycomb structure; and
the dielectric material has a dielectric constant substantially equal to a dielectric constant of the PWB.

12. The system of claim 10, further comprising a plurality of wide angle impedance match "WAIM" layers of material disposed on an exposed surface of the plurality of cylindrical waveguides and an outer surface of the metallic honeycomb structure.

13. The system of claim 10, wherein the metallic honeycomb structure includes aluminum.

14. The system of claim 1, further comprising:
an RF distribution circuit formed on at least one of the second subset of the layers;
a plurality of ground vias extending through the second subset of the layers, the plurality of ground vias being distributed about a perimeter around the second conductive via to provide a waveguide cage around the second conductive via; and
wherein the plurality of ground vias further reduce radio frequency interference "RFI" within the RF distribution circuit.

15. The system of claim 1, further comprising:
a plurality of phased array antenna subarray tile assemblies;
an aperture housing comprising a plurality of cylindrical waveguides coupled to the plurality of subarray tile assemblies;
an array distribution printed wiring board "PWB" coupled to the plurality of subarray tile assemblies; and
a cold plate disposed between the array distribution PWB and the plurality of subarray tile assemblies.

16. A system comprising:
a subarray tile assembly comprising:
a substantially planar printed wiring board "PWB" comprising a plurality of layers;
one or more integrated circuit die coupled to a first surface of the PWB;
at least four antenna elements coupled to a second surface of the PWB, wherein the at least four antenna elements are arranged in a square lattice grid on the PWB;
a first conductive via coupled to the integrated circuit die and extending through a first subset of the layers;
a second conductive via offset from the first conductive via, extending through a second subset of the layers, and coupled to at least one of the at least four antenna elements;
a conductive trace of the PWB coupled to the first and second conductive vias; and
wherein the integrated circuit die is electrically coupled to each of the four antenna elements through the layers.

17. The system of claim 16, wherein the integrated circuit die comprises a silicon germanium alloy.

18. The system of claim 16, wherein the integrated circuit die is configured to receive an RF signal from each of the four antenna elements and convert the corresponding RF signal to a polarized RF signal.

19. The system of claim 16, further comprising:
the first conductive via having a first diameter;
the second conductive via having a second diameter larger than the first diameter; and
wherein the offset of the second conductive via provides a thermal mechanical stress relief to the integrated circuit die.

20. The system of claim 19, wherein the integrated circuit die is a flip chip comprising a plurality of solder bumps coupled to the first surface of the PWB, and wherein at least one of the solder bumps is electrically coupled to the first conductive via.

21. The system of claim 19, further comprising:
an RF distribution circuit formed on at least one of the second subset of the layers;
a plurality of ground vias extending through the second subset of the layers, the plurality of ground vias being distributed about a perimeter around the second conductive via to provide a waveguide cage around the second conductive via; and
wherein the plurality of ground vias further reduce radio frequency interference "RFI" within the RF distribution circuit.

22. A method comprising:
passing an RF signal along a conductive path through a printed wiring board "PWB" between an integrated circuit die and an antenna element, wherein the conductive path comprises:
a first conductive via having a first diameter, the first conductive via being coupled to the integrated circuit die and extending through a first subset of layers of the PWB;
a second conductive via having a second diameter larger than the first diameter, the second conductive via being offset from the first conductive via, extending through a second subset of layers of the PWB, and being coupled to the antenna element; and a conductive trace of the PWB coupled to the first and second conductive vias.

23. The method of claim 22, wherein the integrated circuit die is configured to provide a polarized radio frequency "RF" signal passed to the antenna element through the first and second conductive vias.

24. The method of claim 23, further comprising:
a plurality of the antenna elements;
a plurality of the first and second conductive vias; and
wherein the integrated circuit die is configured to provide a corresponding polarized RF signal passed to each of the antenna elements through corresponding ones of the first and second conductive vias.

25. The method of claim 22, wherein the antenna element is configured to provide a radio frequency "RF" signal passed to the integrated circuit die through the second and first conductive vias, and wherein the integrated circuit die is configured to convert the RF signal provided by the antenna element to a polarized RF signal.

26. The method of claim 25, further comprising:
a plurality of the antenna elements;
a plurality of the first and second conductive vias; and
wherein each antenna element is configured to provide an RF signal passed to the integrated circuit die through corresponding ones of the second and first conductive vias, and wherein the integrated circuit die is configured to convert the RF signal provided by each antenna element to a polarized RF signal.

27. A method comprising:
providing a printed wiring board "PWB" comprising a plurality of layers;
providing an integrated circuit die coupled to a first surface of the PWB;
providing an antenna element coupled to a second surface of the PWB;
electrically coupling the integrated circuit die to a first conductive via extending through a first subset of the layers; and
electrically coupling by a conductive trace of the PWB, the first conductive via to a second conductive via offset from the first conductive via, extending through a second subset of the layers, and coupled to the antenna element.

28. The method of claim 27, wherein providing the integrated circuit die comprises:
coupling a plurality of solder bumps configured on a first surface of the integrated circuit die to the first surface of the PWB, wherein at least one of the solder bumps is electrically coupled to the first conductive via; and
underfilling an area between the integrated circuit die first surface and the first surface of the PWB.

29. The method of claim 27, wherein providing the integrated circuit die comprises:
coupling a plurality of solder bumps configured on a first surface of the integrated circuit die to a first surface of an interposer printed wiring board "PWB";
underfilling an area between the first surface of the integrated circuit die and the first surface of the interposer PWB; and
coupling a ball grid array "BGA" configured on a second surface of the interposer PWB to the first surface of the PWB, wherein at least one of the balls in the BGA is electrically coupled to the first conductive via.

30. The method of claim 27, further comprising:
providing a metallic honeycomb structure;
forming a plurality of cylindrical waveguides within the metallic honeycomb structure, wherein each cylindrical waveguide has a radius that is substantially equal to a radius of a corresponding antenna element;
forming a recess at an intermediate position along a surface of each of the cylindrical waveguides;
filing the cylindrical waveguides and the recesses with a dielectric material, the dielectric material having a dielectric constant that is substantially equal to a dielectric constant of the PWB; and
wherein each filled recess mechanically secures the dielectric material to the cylindrical waveguide.

31. The method of claim 27, further comprising:
forming an RF distribution circuit on at least one of the second subset of the layers;
forming a plurality of ground vias extending through the second subset of the layers, the plurality of ground vias being distributed about a perimeter around the second conductive via to provide a waveguide cage around the second conductive via; and
wherein the plurality of ground vias further reduce radio frequency interference "RFI" within the RF distribution circuit.

32. A method comprising:
providing a metallic honeycomb structure comprising a plurality of cylindrical waveguides configured to interface with a plurality of phased array antenna subarray tile assemblies;
forming a recess at an intermediate position along a surface of each of the cylindrical waveguides;
filling the cylindrical waveguides and the recesses with a dielectric material; and
wherein each filled recess mechanically secures the dielectric material to the cylindrical waveguide.

33. The method of claim 32, wherein the metallic honeycomb structure includes aluminum.

34. The method of claim 32, further comprising a plurality of antenna elements coupled to the plurality of cylindrical waveguides, wherein each cylindrical waveguide has a radius that is substantially equal to a radius of a corresponding antenna element.

35. The method of claim 32, wherein the dielectric material contacts a printed wiring board "PWB" of each of the subarray tile assemblies, wherein the filling the cylindrical waveguides further comprises:
molding a dielectric material in a shape substantially corresponding to the cylindrical waveguide and the recesses, wherein the dielectric material has a coefficient of thermal expansion "CTE" substantially equal to a CTE of the metallic honeycomb structure, and wherein the dielectric material has a dielectric constant substantially equal to a dielectric constant of the PWB; and
placing the molded dielectric material into each of the cylindrical waveguides to fill the cylindrical waveguides and the recesses.

36. The method of claim 32, wherein the dielectric material contacts a printed wiring board "PWB" of each of the subarray tile assemblies, wherein the filling the cylindrical waveguides further comprises:
injecting the dielectric material into each of the cylindrical waveguides and recesses, wherein the dielectric material has a coefficient of thermal expansion "CTE" substantially equal to a CTE of the metallic honeycomb structure, and wherein the dielectric material has a dielectric constant substantially equal to a dielectric constant of the PWB.

* * * * *